(12) United States Patent
Takahashi et al.

(10) Patent No.: US 9,396,974 B2
(45) Date of Patent: Jul. 19, 2016

(54) SUBSTRATE PROCESSING APPARATUS AND SUBSTRATE PROCESSING METHOD

(75) Inventors: Hiroaki Takahashi, Kyoto (JP); Toru Endo, Kyoto (JP); Masahiro Miyagi, Kyoto (JP); Koji Hashimoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 974 days.

(21) Appl. No.: 13/245,375

(22) Filed: Sep. 26, 2011

(65) Prior Publication Data

US 2012/0090649 A1 Apr. 19, 2012

(30) Foreign Application Priority Data

Sep. 27, 2010 (JP) ................................. 2010-215846
Sep. 16, 2011 (JP) ................................. 2011-203460

(51) Int. Cl.
| | |
|---|---|
| *H01L 21/67* | (2006.01) |
| *H01L 21/02* | (2006.01) |
| *G11B 7/26* | (2006.01) |
| *G11B 5/84* | (2006.01) |
| *B05D 1/00* | (2006.01) |
| *H01L 21/687* | (2006.01) |

(52) U.S. Cl.
CPC .......... *H01L 21/67051* (2013.01); *B05D 1/005* (2013.01); *G11B 5/8404* (2013.01); *G11B 7/266* (2013.01); *H01L 21/02052* (2013.01); *H01L 21/68728* (2013.01)

(58) Field of Classification Search
CPC ................................................. H01L 21/02052
USPC ....................................... 134/33, 34
See application file for complete search history.

(56) References Cited

U.S. PATENT DOCUMENTS

| | | | |
|---|---|---|---|
| 6,248,168 B1 | 6/2001 | Takeshita et al. | |
| 7,712,475 B2 * | 5/2010 | Fukuda et al. | ............... 134/94.1 |
| 2001/0017103 A1 | 8/2001 | Takeshita et al. | |
| 2002/0096196 A1 * | 7/2002 | Toshima et al. | .................. 134/21 |
| 2003/0172955 A1 | 9/2003 | Kuroda et al. | .................... 134/2 |
| 2003/0196595 A1 | 10/2003 | Takeshita et al. | |
| 2004/0156996 A1 | 8/2004 | Takeshita et al. | |
| 2004/0187896 A1 | 9/2004 | Konishi et al. | .................. 134/33 |
| 2005/0276921 A1 | 12/2005 | Miya et al. | .................... 427/240 |
| 2006/0086460 A1 * | 4/2006 | Kitamura et al. | ........ 156/345.31 |
| 2006/0292298 A1 | 12/2006 | Takeshita et al. | |
| 2007/0012339 A1 * | 1/2007 | Fukuda et al. | .... H01L 21/68742 134/26 |
| 2008/0017222 A1 | 1/2008 | Miya et al. | |
| 2009/0093126 A1 * | 4/2009 | Garnier | ......................... 438/745 |
| 2009/0194234 A1 * | 8/2009 | Arai et al. | ................ 156/345.23 |
| 2010/0051055 A1 | 3/2010 | Takahashi | |

FOREIGN PATENT DOCUMENTS

| | | |
|---|---|---|
| JP | 2003-100687 | 4/2003 |
| JP | 2003-282514 | 10/2003 |

(Continued)

*Primary Examiner* — Michael Kornakov
*Assistant Examiner* — Natasha Campbell
(74) *Attorney, Agent, or Firm* — Ostrolenk Faber LLP

(57) ABSTRACT

A substrate processing apparatus includes a substrate holding unit that horizontally holds a substrate in non-contact with a major surface of the substrate, a processing liquid supply unit that supplies a processing liquid to the major surface of the substrate held by the substrate holding unit, and a hydrophilic surface placing unit that places an annular hydrophilic surface along a peripheral portion of the major surface of the substrate held by the substrate holding unit such that the hydrophilic surface comes into contact with a liquid film of the processing liquid held on the major surface of the substrate.

10 Claims, 16 Drawing Sheets

(56) References Cited

FOREIGN PATENT DOCUMENTS

| | | |
|---|---|---|
| JP | 2004-319990 | 11/2004 |
| JP | 2010-56420 | 3/2010 |
| JP | 2010-157531 | 7/2010 |
| KR | 1999-0063060 | 7/1999 |

* cited by examiner

SUBSTRATE PROCESSING APPARATUS AND SUBSTRATE PROCESSING METHOD

BACKGROUND OF THE INVENTION

1. Field of the Invention

This invention relates to a substrate processing apparatus and a substrate processing method for processing substrates. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, and substrates for solar cells.

2. Description of Related Art

In a production process in which a semiconductor device, a liquid crystal display device, or the like is produced, a substrate, such as a semiconductor wafer or a glass substrate for a liquid crystal display, is processed by use of a processing liquid. A single substrate processing type substrate processing apparatus includes, for example, a spin chuck that horizontally holds a substrate and that rotates the substrate around a vertical axis passing through the center of the substrate, a nozzle that discharges a processing liquid toward a central portion of an upper surface of the substrate held by the spin chuck, and a processing chamber in which the spin chuck and the nozzle are housed (see U.S. Patent Application Publication No. 2008/017222 A1, for example.)

SUMMARY OF THE INVENTION

In the substrate processing apparatus disclosed by U.S. Patent Application Publication No. 2008/017222 A1, a processing liquid is discharged from the nozzle in a state in which the spin chuck is rotating the substrate, and thereafter the processing liquid discharged therefrom is supplied to the central portion of the upper surface of the substrate. As a result, a substantially circular liquid film of the processing liquid is formed at the central portion of the upper surface of the substrate. Thereafter, this liquid film of the processing liquid spreads outwardly while receiving a centrifugal force caused by the rotation of the substrate. Furthermore, this liquid film of the processing liquid spreads outwardly by the supply of a subsequent processing liquid onto the upper surface of the substrate. Therefore, the liquid film of the processing liquid spreads along the upper surface of the substrate while maintaining its substantially circular shape.

However, there is a case in which, if the upper surface of the substrate is hydrophobic, the liquid film of the processing liquid will spread radially before reaching the peripheral portion of the upper surface of the substrate without spreading to the peripheral portion of the upper surface of the substrate in the substantially circular shape. In other words, there is a case in which a plurality of stripes of the processing liquid that extend from the outer edge of the substantially circular liquid film of the processing liquid in the radial direction will be formed if the upper surface of the substrate is hydrophobic. In this case, the processing liquid is not supplied to the whole of the upper surface of the substrate, and therefore the upper surface of the substrate cannot be processed evenly. Additionally, there is a fear that mists or particles of the processing liquid floating in the processing chamber will adhere to areas not covered with the processing liquid in the upper surface of the substrate, and, as a result, the substrate will be contaminated therewith.

For example, if the processing liquid is discharged from the nozzle at a high flow rate and if the substrate is rotated at a high speed, a portion of the upper surface of the substrate can be restrained or prevented from being exposed even if the upper surface of the substrate is hydrophobic. However, if the processing liquid is discharged from the nozzle at a high flow rate, the consumption of the processing liquid will increase, and therefore running costs will increase. Additionally, if the substrate is rotated at a high speed, the speed of the processing liquid dispersing from the substrate will increase, and therefore an impact will increase when the processing liquid that has dispersed therefrom collides with members disposed around the substrate. Therefore, there is a fear that the amount of mists of the processing liquid generated will increase and that the mists of the processing liquid will adhere to the substrate or adhere to members disposed in the processing chamber.

It is therefore an object of the present invention to provide a substrate processing apparatus and a substrate processing method capable of reducing the consumption of a processing liquid and capable of supplying a processing liquid onto the whole area of a major surface of a substrate.

One embodiment of the present invention provides a substrate processing apparatus that includes a substrate holding unit that horizontally holds a substrate in non-contact with a major surface of the substrate, a processing liquid supply unit that supplies a processing liquid to the major surface of the substrate held by the substrate holding unit, and a hydrophilic surface placing unit that places an annular hydrophilic surface along a peripheral portion of the major surface of the substrate held by the substrate holding unit such that the hydrophilic surface comes into contact with a liquid film of the processing liquid held on the major surface of the substrate.

The major surface of the substrate may be an upper surface of the substrate or may be a lower surface of the substrate.

When a liquid is supplied to a hydrophilic solid surface, the liquid spreads along the solid surface, and a thin liquid film is formed. On the other hand, when a liquid is supplied to a hydrophobic solid surface, the liquid does not spread along the solid surface, and liquid droplets are formed. In other words, the hydrophilic solid surface is easily wetted, whereas the hydrophobic solid surface is not easily wetted. However, the present inventor has found that, even if hydrophobic areas are contained in a solid surface, a liquid can be spread along the solid surface in the same way as when a liquid is supplied to a hydrophilic solid surface.

In more detail, the present inventor has found that the boundary (at which a liquid surface intersects with a solid surface) between an area (covered area) covered with a liquid in the solid surface and an area (uncovered area) not covered with the liquid greatly influences the spreading of the liquid. In other words, as shown in FIG. 11, even hydrophobic areas are contained in the solid surface, a liquid supplied to the solid surface spreads along the solid surface, and forms a thin liquid film in the same way as when a liquid is supplied to a hydrophilic solid surface if the boundary between the covered area and the uncovered area reaches hydrophilic areas. Therefore, a large range can be wetted with a small amount of liquid by allowing the boundary between the covered area and the uncovered area to reach hydrophilic areas.

According to this structure of the embodiment of the present invention, the substrate can be horizontally held by the substrate holding unit in non-contact with the major surface of the substrate. Additionally, a liquid film of a processing liquid with which the major surface of the substrate is covered can be formed by allowing the processing liquid supply unit to supply a processing liquid to the major surface of the substrate held by the substrate holding unit. Still additionally, the hydrophilic surface placing unit can place the annular hydrophilic surface being contact with the liquid film of the processing liquid held on the major surface of the substrate along the peripheral portion of the major surface of the substrate. Hence, the boundary between the covered area and the uncovered area can be located in a hydrophilic area, i.e., can be located on the hydrophilic surface. Therefore, even if the major surface of the substrate is hydrophobic or even if a hydrophobic area is contained in the major surface of the substrate, the whole area of the major surface of the substrate can be covered with the processing liquid while reducing the consumption of the processing liquid.

The hydrophilic surface placing unit may include an annular hydrophilic surface that is disposed along a horizontal plane including the major surface of the substrate held by the substrate holding unit and that surrounds the peripheral portion of the major surface of the substrate.

In this case, the outer edge of the liquid film of the processing liquid held on the major surface of the substrate can be allowed to reach the annular hydrophilic surface by allowing the processing liquid supply unit to supply a processing liquid to the major surface of the substrate held by the substrate holding unit. In other words, the boundary between the covered area and the uncovered area can be located on the annular hydrophilic surface that is a hydrophilic area. Therefore, even if the major surface of the substrate is hydrophobic or even if a hydrophobic area is contained in the major surface of the substrate, the whole area of the major surface of the substrate can be covered with the processing liquid while reducing the consumption of the processing liquid.

The substrate processing apparatus may further include an annular hydrophobic surface that is disposed along the horizontal plane including the major surface of the substrate held by the substrate holding unit and that surrounds the annular hydrophilic surface.

In this case, the annular hydrophilic surface is surrounded by the annular hydrophobic surface. The annular hydrophobic surface is hydrophobic. Therefore, when a processing liquid moves from the annular hydrophilic surface to the annular hydrophobic surface, this processing liquid undergoes resistance, and is stopped inside the annular hydrophobic surface. As a result, it is possible to gather the processing liquid inside the annular hydrophobic surface and to maintain a state in which the whole area of the major surface of the substrate is covered with the processing liquid. Hence, the consumption of the processing liquid can be further reduced.

The substrate holding unit may be arranged to horizontally hold the substrate in non-contact with an upper surface of the substrate and in non-contact with a lower surface of the substrate. The processing liquid supply unit may be arranged to supply a processing liquid to the upper surface and the lower surface of the substrate held by the substrate holding unit. The annular hydrophilic surface may include an upper annular hydrophilic surface that is disposed along a horizontal plane including the upper surface of the substrate held by the substrate holding unit and that surrounds a peripheral portion of the upper surface of the substrate, and a lower annular hydrophilic surface that is disposed along a horizontal plane including the lower surface of the substrate held by the substrate holding unit and that surrounds a peripheral portion of the lower surface of the substrate.

In this case, the substrate can be horizontally held by the substrate holding unit in non-contact with the upper surface of the substrate and in non-contact with the lower surface of the substrate. Therefore, a liquid film of the processing liquid with which the whole area of the upper surface of the substrate is covered and a liquid film of the processing liquid with which the whole area of the lower surface of the substrate is covered can be formed by supplying the processing liquid from the processing liquid supply unit to the upper surface and the lower surface of the substrate held by the substrate holding unit. Additionally, even if the upper surface and the lower surface of the substrate are hydrophobic and even if a hydrophobic area is contained in the upper surface and the lower surface of the substrate, the consumption of the processing liquid can be reduced, and the whole area of the upper surface and the whole area of the lower surface of the substrate can be covered with the processing liquid by allowing the outer edge of the liquid film of the processing liquid held on the upper surface of the substrate to reach the upper annular hydrophilic surface and by allowing the outer edge of the liquid film of the processing liquid held on the lower surface of the substrate to reach the lower annular hydrophilic surface. Hence, the upper surface and the lower surface of the substrate can be processed while reducing the consumption of the processing liquid. Additionally, the upper surface and the lower surface of the substrate can be simultaneously processed, and therefore a processing time can be shortened.

The hydrophilic surface placing unit may include an annular facing hydrophilic surface that faces the peripheral portion of the major surface of the substrate held by the substrate holding unit.

In this case, the annular facing hydrophilic surface that faces the peripheral portion of the major surface of the substrate held by the substrate holding unit is provided, and therefore a processing liquid can be allowed to enter a space between the peripheral portion of the major surface of the substrate and the facing hydrophilic surface by allowing the processing liquid supply unit to supply the processing liquid to the major surface of the substrate held by the substrate holding unit. Hence, the outer edge of the liquid film of the processing liquid held on the major surface of the substrate can be allowed to reach the facing hydrophilic surface. In other words, the boundary between the covered area and the uncovered area can be located on the facing hydrophilic surface that is a hydrophilic area. Therefore, even if the major surface of the substrate is hydrophobic and even if a hydrophobic area is contained in the major surface of the substrate, the whole area of the major surface of the substrate can be covered with the processing liquid while reducing the consumption of the processing liquid.

The substrate processing apparatus may further include an annular hydrophobic surface that surrounds the facing hydrophilic surface.

In this case, the facing hydrophilic surface is surrounded by the annular hydrophobic surface, and therefore, when a processing liquid moves outwardly beyond the facing hydrophilic surface, this processing liquid receives resistance from the annular hydrophobic surface, and is stopped inside the annular hydrophobic surface. Therefore, without supplying the processing liquid to the substrate at a high flow rate, it is possible to maintain a state in which the whole area of the major surface of the substrate is covered with the processing liquid. Hence, the consumption of the processing liquid can be reduced, and the processing liquid can be supplied to the whole area of the major surface of the substrate.

The hydrophilic surface placing unit may include a protective liquid supply unit that supplies a protective liquid, which protects the major surface of the substrate from a processing liquid, to the peripheral portion of the major surface of the substrate held by the substrate holding unit.

In this case, the peripheral portion of the major surface of the substrate can be protected from the processing liquid by allowing the protective liquid supply unit to supply a protective liquid to the peripheral portion of the major surface of the substrate held by the substrate holding unit. In more detail, for example, even if the major surface of the substrate is hydrophilic and even if the processing liquid supplied from the processing liquid supply unit is a processing liquid by which the major surface of the substrate is changed to be hydrophobic, the peripheral portion of the major surface of the substrate can be kept hydrophilic by allowing the protective liquid to protect the peripheral portion of the major surface of the substrate. Hence, the boundary between the covered area and the uncovered area can be located at the peripheral portion of the major surface of the substrate that is a hydrophilic area. Therefore, even if a hydrophobic area is contained in the major surface of the substrate, the whole area of the major surface of the substrate can be covered with the processing liquid while reducing the consumption of the processing liquid.

The substrate holding unit may be arranged to horizontally hold the substrate in non-contact with an upper surface of the substrate and in non-contact with a lower surface of the substrate. The processing liquid supply unit may be arranged to supply a processing liquid to the upper surface and the lower surface of the substrate held by the substrate holding unit. The protective liquid supply unit may include an upper surface protective liquid supply unit that supplies the protective liquid to a peripheral portion of the upper surface of the substrate held by the substrate holding unit, and a lower surface protective liquid supply unit that supplies the protective liquid to a peripheral portion of the lower surface of the substrate held by the substrate holding unit.

In this case, the peripheral portion of the upper surface of the substrate can be protected from the processing liquid by allowing the upper surface protective liquid supply unit to supply the protective liquid to the peripheral portion of the upper surface of the substrate held by the substrate holding unit. Likewise, the peripheral portion of the lower surface of the substrate can be protected from the processing liquid by allowing the lower surface protective liquid supply unit to supply the protective liquid to the peripheral portion of the lower surface of the substrate held by the substrate holding unit. Hence, the boundary between the covered area and the uncovered area can be located at the peripheral portion of the upper surface and the peripheral portion of the lower surface of the substrate that are hydrophilic areas. Therefore, even if a hydrophobic area is contained in the upper surface and the lower surface of the substrate, the whole area of the upper surface and the whole area of the lower surface of the substrate can be covered with the processing liquid while reducing the consumption of the processing liquid. Hence, the upper surface and the lower surface of the substrate can be processed while reducing the consumption of the processing liquid. Additionally, the upper surface and the lower surface of the substrate can be simultaneously processed, and therefore a processing time can be shortened.

Another embodiment of the present invention provides a substrate processing method that includes a processing liquid supply step of supplying a processing liquid to a major surface of a substrate horizontally held in non-contact with the major surface of the substrate, and a hydrophilic surface placing step of placing an annular hydrophilic surface along a peripheral portion of the major surface of the substrate such that the hydrophilic surface comes into contact with a liquid film of the processing liquid held on the major surface of the substrate in parallel with the processing liquid supply step. According to this method, the same effect as above can be fulfilled.

The processing liquid supply step may include a step of simultaneously supplying the processing liquid to an upper surface and a lower surface of the substrate horizontally held in non-contact with the upper surface of the substrate and in non-contact with the lower surface of the substrate. The hydrophilic surface placing step may include an upper hydrophilic surface placing step of placing an annular upper hydrophilic surface along a peripheral portion of the upper surface of the substrate such that the upper hydrophilic surface comes into contact with a liquid film of the processing liquid held on the upper surface of the substrate in parallel with the processing liquid supply step, and a lower hydrophilic surface placing step of placing an annular lower hydrophilic surface along a peripheral portion of the lower surface of the substrate such that the lower hydrophilic surface comes into contact with a liquid film of the processing liquid held on the lower surface of the substrate in parallel with the processing liquid supply step. According to this method, the same effect as above can be fulfilled.

Still another embodiment of the present invention provides a substrate processing apparatus that includes a substrate holding unit that horizontally holds a substrate in non-contact with a major surface of the substrate; a processing liquid supply unit that supplies a processing liquid to the major surface of the substrate held by the substrate holding unit; a substrate rotating unit that rotates the substrate around a rotational axis intersecting with the substrate held by the substrate holding unit; and an annular member having an annular hydrophobic surface that is disposed along a horizontal plane on a major surface side of the substrate and that is disposed along a peripheral portion of the major surface of the substrate, the horizontal plane differing in height from the substrate held by the substrate holding unit.

According to this structure, the processing liquid supply unit can supply a processing liquid to the major surface of the substrate held by the substrate holding unit. Additionally, the substrate rotating unit can rotate the substrate around the rotational axis intersecting with the substrate. Therefore, a liquid film of a processing liquid which covers the whole area of the major surface of the substrate can be formed by supplying the processing liquid from the processing liquid supply unit to the substrate. Additionally, the processing liquid held at the major surface of the substrate can be discharged from the peripheral portion of the major surface of the substrate by causing the substrate rotating unit rotate the substrate. The hydrophobic surface is disposed along the peripheral portion of the major surface of the substrate at a height differing from that of the substrate, and therefore the processing liquid discharged from the peripheral portion of the major surface of the substrate comes into contact with the hydrophobic surface, and receives resistance from the hydrophobic surface. Therefore, the discharge of the processing liquid from the substrate can be regulated, and the processing liquid can be stopped inside the hydrophobic surface. Therefore, without supplying the processing liquid to the substrate at a high flow rate, it is possible to maintain a state in which the whole area of the major surface of the substrate is covered with the liquid film of the processing liquid. As a result, the processing liquid can be supplied to the whole area of the major surface of the substrate while reducing the consumption of the processing liquid.

The outer edge of the hydrophobic surface may be disposed outside the outer end of the substrate held by the substrate holding unit.

In this case, the outer edge of the hydrophobic surface is disposed outside the outer end of the substrate, and therefore the scattering direction of the processing liquid discharged from the substrate is limited by the hydrophobic surface. In more detail, for example, if the hydrophobic surface is disposed above the substrate, the processing liquid will be restrained from being scattered from the peripheral portion of the upper surface of the substrate in an obliquely upward direction. Likewise, if the hydrophobic surface is disposed below the substrate, the processing liquid will be restrained from being scattered from the peripheral portion of the lower surface of the substrate in an obliquely downward direction. Hence, the scattering range of the processing liquid can be narrowed. Therefore, members disposed around the substrate can be restrained or prevented from being contaminated with mists of the processing liquid. Therefore, particles adhering to these members can be restrained or prevented from moving to the substrate and contaminating this substrate.

Additionally, the inner edge of the hydrophobic surface may be disposed inside the outer end of the substrate held by the substrate holding unit.

In this case, the inner edge of the hydrophobic surface is disposed inside the outer end of the substrate, and therefore the inner edge of the hydrophobic surface faces the peripheral portion of the major surface of the substrate. Usually, the major surface of the substrate is higher in dimensional accuracy than the peripheral end surface of the substrate. Therefore, a variation in the clearance between the hydrophobic surface and the substrate is smaller than in a case in which the inner edge of the hydrophobic surface is disposed outside the outer end of the substrate, and faces the peripheral end surface of the substrate. In other words, the magnitude of the clearance between the hydrophobic surface and the substrate is constant over the whole circumference. Therefore, the flow rate of a processing liquid that flows between the hydrophobic surface and the substrate and that is discharged from the substrate is constant in each position. Therefore, the liquid film of the processing liquid can be restrained or prevented from being broken from its peripheral portion because of the quantitative over-concentration of the processing liquid discharged from the substrate. Hence, without supplying the processing liquid to the substrate at a high flow rate, it is possible to maintain a state in which the whole area of the major surface of the substrate is covered with the liquid film of the processing liquid.

Still another embodiment of the present invention provides a substrate processing method that includes a processing liquid supply step of supplying a processing liquid to a major surface of a substrate horizontally held in non-contact with the major surface of the substrate; a substrate rotating step of rotating the substrate around a rotational axis intersecting with the substrate in parallel with the processing liquid supply step; and a processing-liquid-discharge regulating step of, in parallel with the processing liquid supply step, regulating a discharge of the processing liquid from the substrate by bringing an annular hydrophobic surface into contact with a liquid film of the processing liquid held at the major surface of the substrate, the annular hydrophobic surface being disposed along a horizontal plane on a major surface side of the substrate and being disposed along a peripheral portion of the major surface of the substrate, the horizontal plane differing in height from the substrate. According to this method, the same effect as above can be fulfilled.

The foregoing and other objects, features and effects of the present invention will become more apparent from the following detailed description of the preferred embodiments with reference to the attached drawings.

DETAILED DESCRIPTION OF PREFERRED EMBODIMENTS

In the following description, the term "hydrophilic" denotes that a contact angle with water is smaller than that between the substrate and water, whereas the term "hydrophobic" denotes that a contact angle with water is greater than that between the substrate and water. A contact angle between a silicon substrate from which a silicon oxide film has been removed (i.e., hydrogen-terminated silicon substrate) and water is about 70 degrees. Therefore, if the substrate is a silicon substrate from which a silicon oxide film has been removed, the term "hydrophilic" denotes that the contact angle of water is smaller than 70 degrees, and the term "hydrophobic" denotes that the contact angle of water is greater than 70 degrees.

First Embodiment

Figure 1:
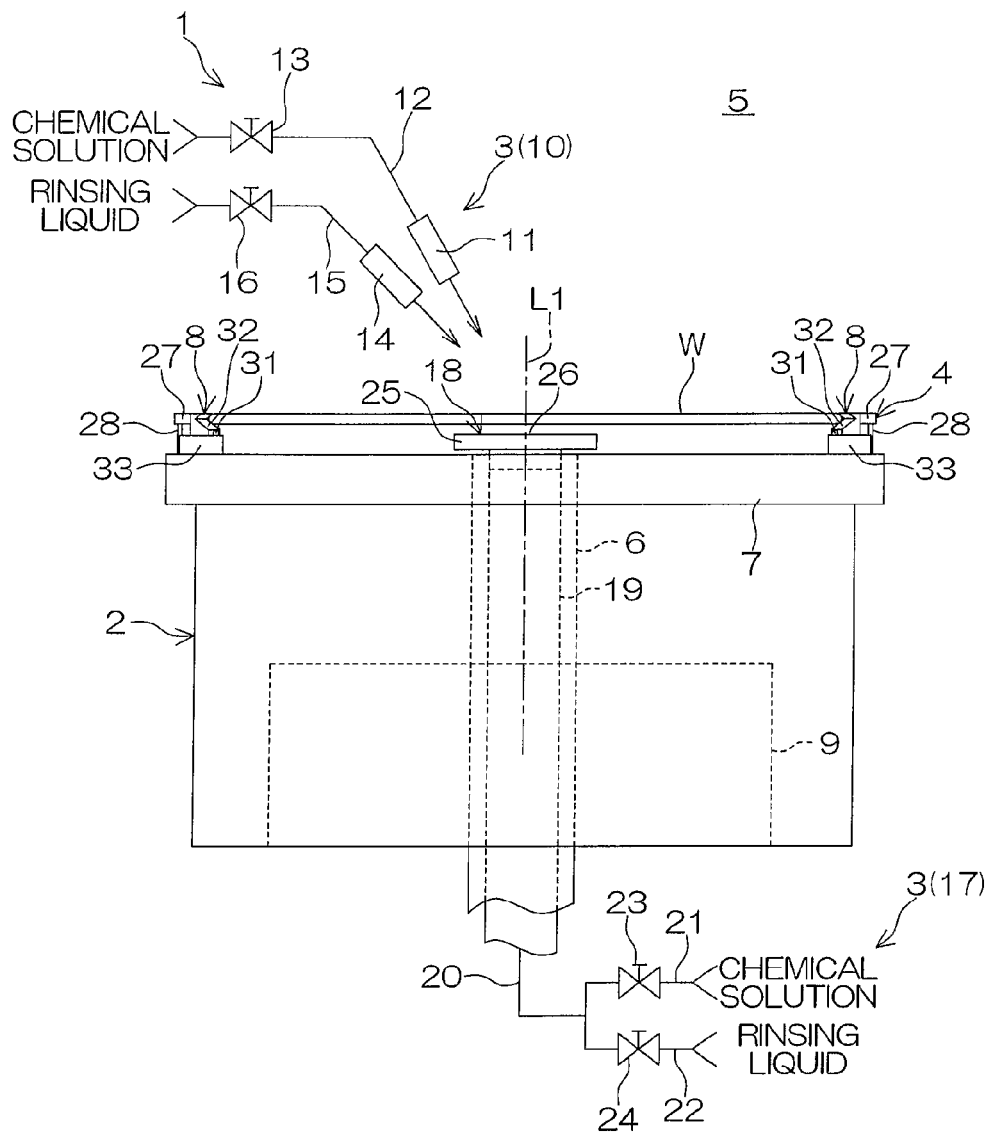
FIG. 1 is a side view showing a schematic structure of a substrate processing apparatus according to a first embodiment of the present invention.
Figure 2:
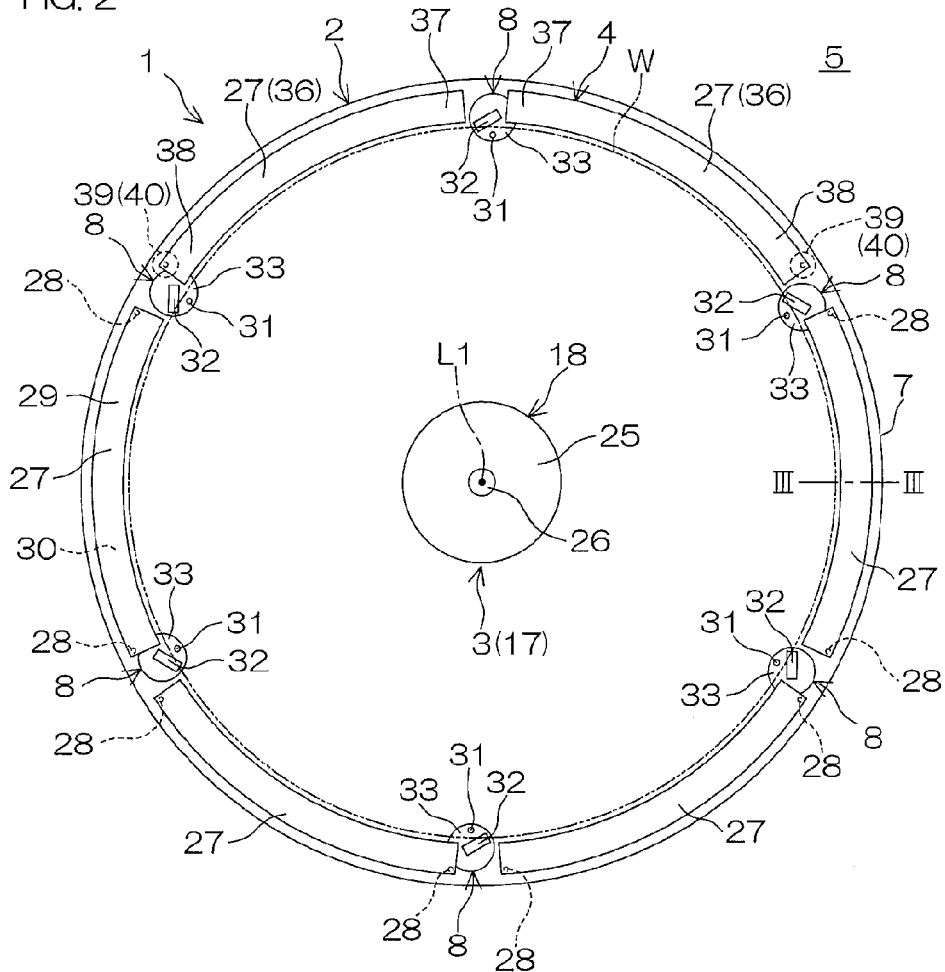
FIG. 2 is a plan view showing the schematic structure of the substrate processing apparatus according to the first embodiment of the present invention.
Figure 3:
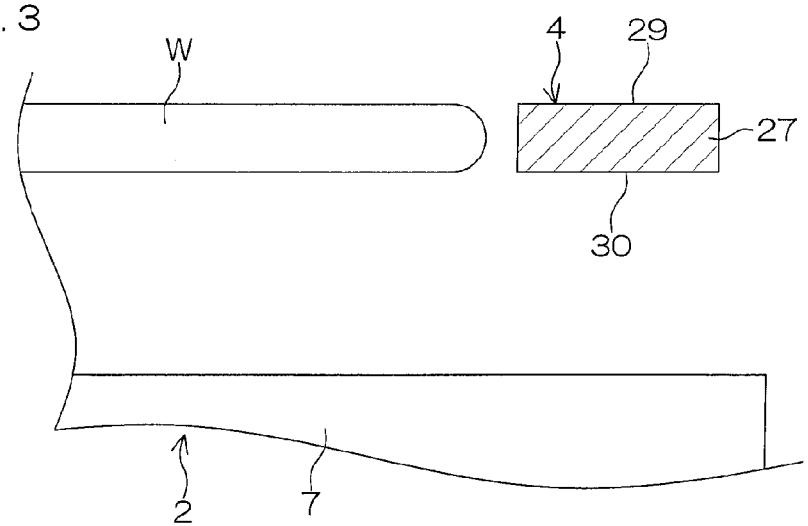
FIG. 3 is a partially sectional view along line III-III of FIG. 2.

FIG. 1 is a side view showing a schematic structure of a substrate processing apparatus 1 according to a first embodiment of the present invention. FIG. 2 is a plan view showing the schematic structure of the substrate processing apparatus 1 according to the first embodiment of the present invention. FIG. 3 is a partially sectional view along line III-III of FIG. 2.

The substrate processing apparatus 1 is a single substrate processing type substrate processing apparatus that processes circular substrates W, such as semiconductor wafers, one by one. The substrate processing apparatus 1 includes a spin chuck 2 (i.e., a substrate holding unit) that horizontally holds and rotates a substrate W, a processing liquid supply unit 3 that supplies a processing liquid to the substrate W held by the spin chuck 2, and an annular member 4 (i.e., a hydrophilic surface placing unit) that surrounds the substrate W held by the spin chuck 2. The spin chuck 2 and the annular member 4 are disposed in a processing chamber 5 defined by a partition wall (not shown).

The spin chuck 2 includes a cylindrical rotational shaft 6 that extends perpendicularly, a disk-shaped spin base 7 horizontally attached to an upper end of the rotational shaft 6, a plurality of (i.e., three or more) gripping members 8 disposed on the spin base 7, and a spin motor 9 connected to the rotational shaft 6. The gripping members 8 are spaced at appropriate intervals on a circumference corresponding to the outer peripheral shape of the substrate W at a peripheral portion of an upper surface of the spin base 7. The gripping members 8 are brought into contact with a peripheral end surface of the substrate W, and, accordingly, the spin chuck 2 can grip the substrate W so that the substrate W becomes horizontal. As a result, the substrate W can be horizontally held at grip positions (shown in FIGS. 1 and 3) arranged above the spin base 7. As described later, the spin chuck 2 can horizontally hold the substrate W at two positions, i.e., at a support position arranged above the spin base 7 and at a grip position arranged above the support position. A driving force of the spin motor 9 is applied to the rotational shaft 6 in a state in which the substrate W is held at the grip position, and, as a result, the substrate W rotates around a vertical rotational axis L1 that passes through the center of the substrate W.

The processing liquid supply unit 3 includes an upper-surface processing liquid supply unit 10 that supplies a processing liquid to the upper surface of the substrate W held by the spin chuck 2. The upper-surface processing liquid supply unit 10 includes a first chemical solution nozzle 11, a first chemical solution supply pipe 12, and a first chemical solution valve 13. The upper-surface processing liquid supply unit 10 additionally includes a first rinsing liquid nozzle 14, a first rinsing liquid supply pipe 15, and a first rinsing liquid valve 16. The first chemical solution supply pipe 12 is connected to the first chemical solution nozzle 11. The first chemical solution valve 13 is interposed in the first chemical solution supply pipe 12. The first rinsing liquid supply pipe 15 is connected to the first rinsing liquid nozzle 14. The first rinsing liquid valve 16 is interposed in the first rinsing liquid supply pipe 15.

When the first chemical solution valve 13 is opened, a chemical solution is supplied from the first chemical solution supply pipe 12 to the first chemical solution nozzle 11. When the first chemical solution valve 13 is closed, the chemical solution stops being supplied from the first chemical solution supply pipe 12 to the first chemical solution nozzle 11. The chemical solution discharged from the first chemical solution nozzle 11 is supplied to a central portion of the upper surface of the substrate W held by the spin chuck 2. Likewise, when the first rinsing liquid valve 16 is opened, a rinsing liquid is supplied from the first rinsing liquid supply pipe 15 to the first rinsing liquid nozzle 14. When the first rinsing liquid valve 16 is closed, the rinsing liquid stops being supplied from the first rinsing liquid supply pipe 15 to the first rinsing liquid nozzle 14. The rinsing liquid discharged from the first rinsing liquid nozzle 14 is supplied to the central portion of the upper surface of the substrate W held by the spin chuck 2.

The processing liquid supply unit 3 includes a lower-surface processing liquid supply unit 17 that supplies a processing liquid to a lower surface of the substrate W held by the spin chuck 2. The lower-surface processing liquid supply unit 17 includes a lower surface nozzle 18 that discharges a processing liquid toward the lower surface of the substrate W held by the spin chuck 2, a first processing liquid supply. pipe 19 that extends upwardly and downwardly in the rotational shaft 6, and a second processing liquid supply pipe 20 connected to the first processing liquid supply pipe 19. The lower-surface processing liquid supply unit 17 additionally includes a second chemical solution supply pipe 21 and a second rinsing liquid supply pipe 22 both of which are connected to the second processing liquid supply pipe 20, a second chemical solution valve 23 interposed in the second chemical solution supply pipe 21, and a second rinsing liquid valve 24 interposed in the second rinsing liquid supply pipe 22. The lower surface nozzle 18 includes a facing portion 25 that faces the lower surface of the substrate W held by the spin chuck 2. The facing portion 25 is disposed above the spin base

7. The facing portion 25 is, for example, a disk-shaped one disposed along a horizontal plane. The facing portion 25 has a processing liquid discharge port 26 through which a processing liquid is discharged toward a central portion of the lower surface of the substrate W held by the spin chuck 2.

When the second chemical solution valve 23 is opened, a chemical solution is supplied from the first processing liquid supply pipe 19 to the lower surface nozzle 18 via the second processing liquid supply pipe 20. When the second chemical solution valve 23 is closed, the chemical solution stops being supplied to the lower surface nozzle 18. The chemical solution supplied to the lower surface nozzle 18 is discharged upwardly from the processing liquid discharge port 26. As a result, the chemical solution is supplied to the central portion of the lower surface of the substrate W held by the spin chuck 2. Likewise, when the second rinsing liquid valve 24 is opened, a rinsing liquid is supplied from the first processing liquid supply pipe 19 to the lower surface nozzle 18 via the second processing liquid supply pipe 20. When the second rinsing liquid valve 24 is closed, the rinsing liquid stops being supplied to the lower surface nozzle 18. The rinsing liquid supplied to the lower surface nozzle 18 is discharged upwardly from the processing liquid discharge port 26, and is supplied to the central portion of the lower surface of the substrate W held by the spin chuck 2.

A solution including at least one among sulfuric acid, acetic acid, nitric acid, hydrochloric acid, hydrofluoric acid, buffered hydrogen fluoride (BHF), aqueous ammonia, hydrogen peroxide solution, organic acid (e.g., citric acid or oxalic acid), organic alkali (e.g., tetramethylammonium hydroxide (TMAH)), surfactant, and corrosion inhibitor can be mentioned as the chemical solution to be supplied from the processing liquid supply unit 3 to the substrate W. Pure water (deionized water), carbonated water, electrolyzed ion water, hydrogen water, ozone water, or aqueous hydrochloric acid of dilute concentration (e.g., about 10 to 100 ppm) can be mentioned as the rinsing liquid to be supplied from the processing liquid supply unit 3 to the substrate W.

The annular member 4 is disposed above the spin base 7. The annular member 4 surrounds the substrate W held at the grip positions (shown in FIG. 1 and FIG. 3) with a gap between the annular member 4 and the substrate W in the radial direction. The annular member 4 is disposed along the circumference of a circle having its center on the rotational axis L1. The annular member 4 is shaped such that a ring, which is circular when viewed planarly and which has a cylindrical inner circumferential surface and a cylindrical outer circumferential surface, is divided into a plurality of pieces at equal intervals in the circumferential direction. In other words, the annular member 4 has a plurality of divided members 27 each of which has the shape of a circular arc. The divided members 27 are spaced at equal intervals in the circumferential direction of the annular member 4. Each of the divided members 27 is supported by support pillars 28 connected to the spin base 7. Each of the divided members 27 rotates together with the spin base 7 around the rotational axis L1. The inner surface of the divided member 27 faces the peripheral end surface of the substrate W held at the grip positions with a gap therebetween in the radial direction. The gripping members 8 are disposed such that a portion (i.e., a gripping portion 32 described later) of the gripping member 8 is located between end surfaces of the divided members 27 that face each other in the circumferential direction when viewed planarly.

As shown in FIG. 3, the annular member 4 has an upper annular hydrophilic surface 29 (hydrophilic surface, annular hydrophilic surface, upper hydrophilic surface) and a lower annular hydrophilic surface 30 (hydrophilic surface, annular hydrophilic surface, lower hydrophilic surface). The upper annular hydrophilic surface 29 is an upper surface of the divided members 27, and the lower annular hydrophilic surface 30 is a lower surface of the divided members 27. The upper annular hydrophilic surface 29 is disposed along a horizontal plane including the upper surface of the substrate W held at the grip positions, and surrounds the peripheral portion of the upper surface of the substrate W. Likewise, the lower annular hydrophilic surface 30 is disposed along a horizontal plane including the lower surface of the substrate W held at the grip positions, and surrounds the peripheral portion of the lower surface of the substrate W. The upper annular hydrophilic surface 29 may be disposed at the same height as the upper surface of the substrate W held at the grip positions, or may be disposed above or below the upper surface of the substrate W. Likewise, the lower annular hydrophilic surface 30 may be disposed at the same height as the lower surface of the substrate W held at the grip positions, or may be disposed above or below the lower surface of the substrate W. In the first embodiment, the upper annular hydrophilic surface 29 is disposed at the same height as the upper surface of the substrate W held at the grip positions, and the lower annular hydrophilic surface 30 is disposed at the same height as the lower surface of the substrate W.

The contact angle of water with respect to the upper annular hydrophilic surface 29 and with respect to the lower annular hydrophilic surface 30 is, for example, less than 70 degrees. The hydrophilicity of the upper annular hydrophilic surface 29 and that of the lower annular hydrophilic surface 30 are at least required to be higher than the hydrophilicity of a hydrogen-terminated silicon substrate, and, more preferably, the upper and lower annular hydrophilic surfaces 29 and 30 are substantially equal in hydrophilicity to a silicone oxide film the contact angle of water to which is about ten degrees.

Figure 4:
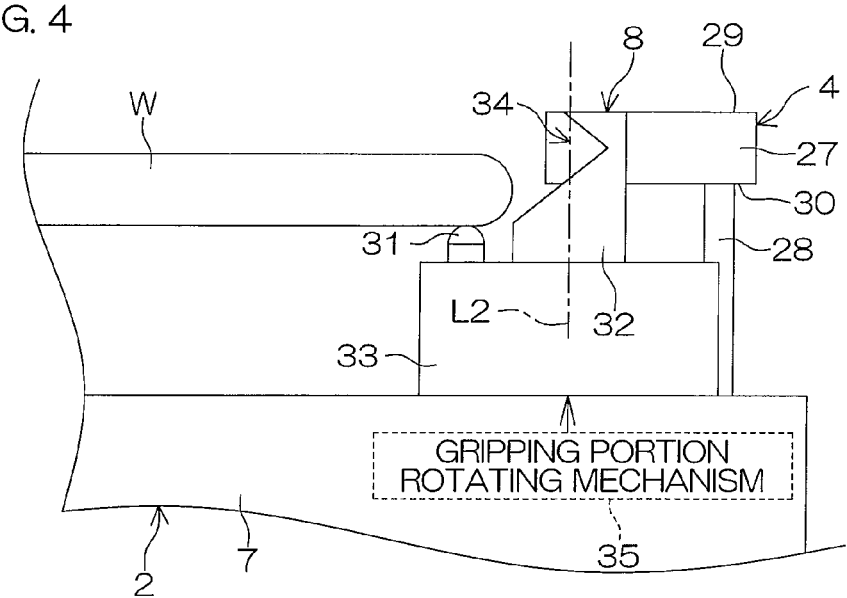
FIG. 4 is a side view of a gripping member and a structure relative to this member according to the first embodiment of the present invention.
Figure 5:
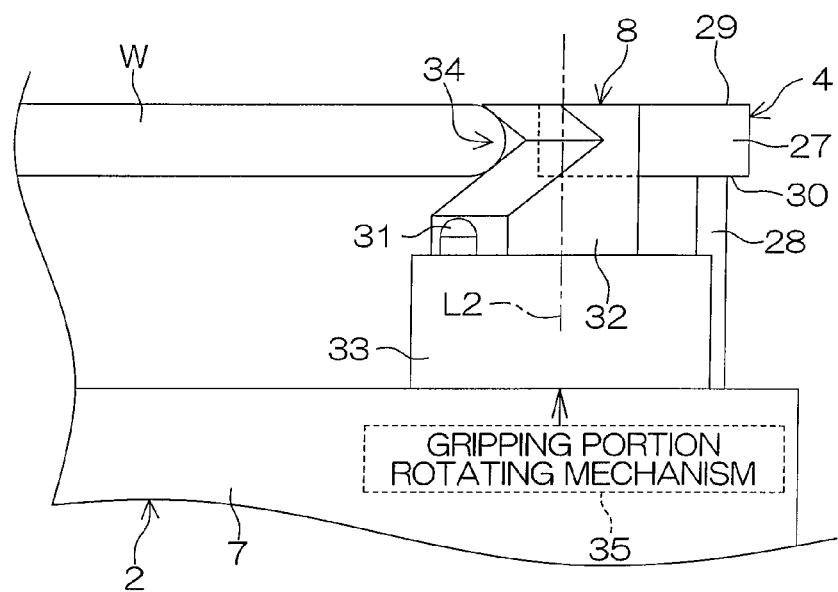
FIG. 5 is a side view of the gripping member and the structure relative to this member according to the first embodiment of the present invention.
Figure 6:
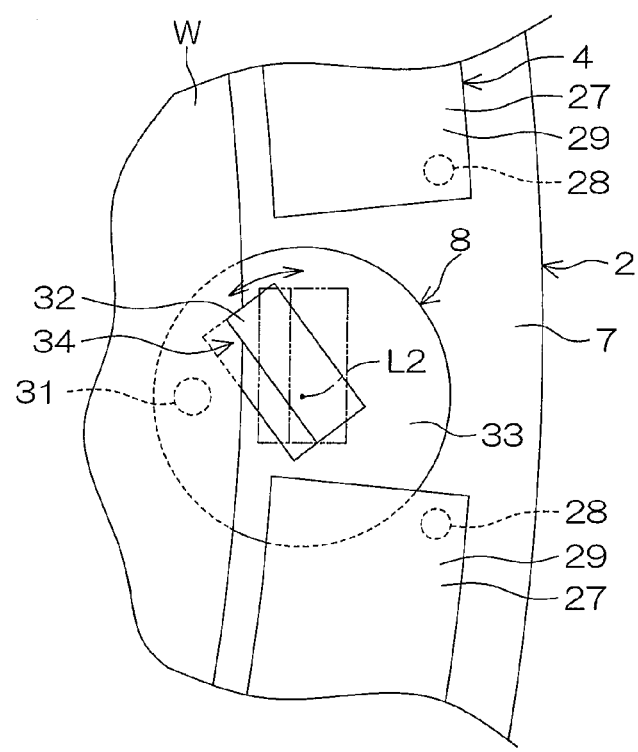
FIG. 6 is a plan view of the gripping member and the structure relative to this member according to the first embodiment of the present invention.

FIG. 4 and FIG. 5 are side views of the gripping member 8 and a structure relative to this member according to the first embodiment of the present invention. FIG. 6 is a plan view of the gripping member 8 and the structure relative to this member according to the first embodiment of the present invention. FIG. 4 shows a state in which the substrate W is horizontally held at the support position, whereas FIG. 5 shows a state in which the substrate W is horizontally held at the grip position.

The spin chuck 2 can horizontally hold the substrate W at the two positions, i.e., the support position and the grip position. In detail, the gripping member 8 includes a supporting portion 31 that horizontally supports the substrate W at the support position, a gripping portion 32 that horizontally grips the substrate W at the grip position, and a base 33 that supports the supporting portion 31 and the gripping portion 32. The base 33 is disposed on the spin base 7. The supporting portion 31 and the gripping portion 32 are disposed on the base 33. The gripping portion 32 has a V-shaped holding groove 34 that opens in the horizontal direction. The holding groove 34 is directed inwardly (i.e., toward the rotational axis L1 of the substrate W). The gripping portion 32 is rotatable around the vertical axial line L2 with respect to the base 33. The supporting portion 31 is disposed more inwardly than the vertical axial line L2. The divided member 27 is disposed above the base 33. The base 33 and the divided member 27 are overlapped with each other when viewed planarly.

The spin chuck 2 includes a gripping portion rotating mechanism 35 that rotates the gripping portion 32 around the vertical axial line L2 with respect to the base 33. The gripping portion rotating mechanism 35 is housed in, for example, the spin base 7. The gripping portion rotating mechanism 35 rotates the gripping portion 32 around the vertical axial line L2 between a contact position (shown in FIG. 5) at which the gripping portion 32 comes into contact with the peripheral end surface of the substrate W and a retreat position (shown in FIG. 4) to which the gripping portion 32 is retreated from the peripheral end surface of the substrate W. Furthermore, the gripping portion rotating mechanism 35 synchronously rotates the gripping portions 32 around the vertical axial line L2. As shown in FIG. 6, the divided members 27 are disposed so as not to be overlapped with an area in which the gripping portion 32 rotates and goes between the contact position and the retreat position. This makes it possible to prevent the gripping portion 32 from colliding with the divided member 27 because of the rotation of the gripping portion 32.

The substrate W carried in the spin chuck 2 is placed on the supporting portions 31 in a state in which the gripping portions 32 are located at the retreat positions, respectively. The substrate W is placed on the supporting portions 31, and, as a result, each of the supporting portions 31 comes into point contact with the peripheral portion of the lower surface of the substrate W, and the substrate W is horizontally held at the support positions. Furthermore, the gripping portion rotating mechanism 35 rotates the gripping portions 32 from the retreat position to the contact position in a state in which the substrate W is horizontally held at the support positions, and, as a result, the peripheral portion of the substrate W enters the inside of the holding groove 34, and the substrate W is lifted upwardly because of the inclination of the holding groove 34. As a result, the supporting portion 31 recedes from the lower surface of the substrate W, and the substrate W is horizontally held at the grip positions. In other words, at the grip positions, the substrate W is horizontally held in a state of being in non-contact with the upper and lower surfaces of the substrate W.

Figure 7:
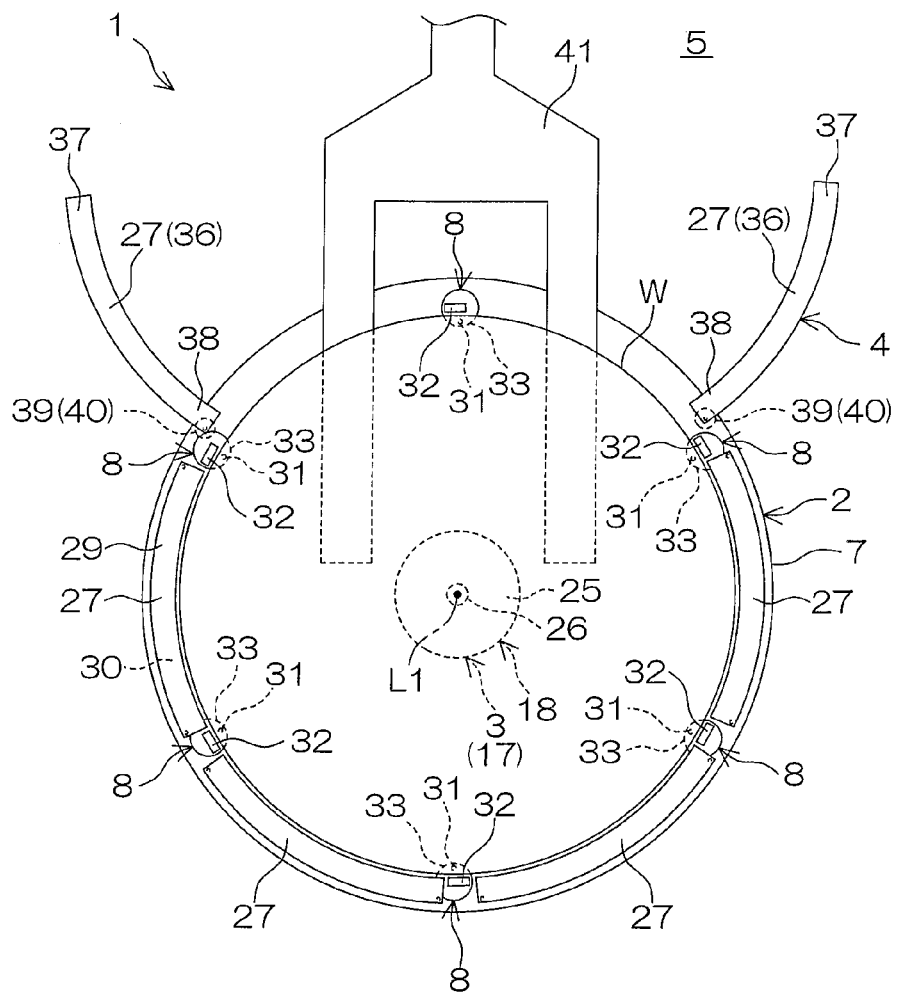
FIG. 7 is a plan view showing a schematic structure of the substrate processing apparatus according to the first embodiment of the present invention.

FIG. 7 is a plan view showing a schematic structure of the substrate processing apparatus 1 according to the first embodiment of the present invention. Hereinafter, reference is made to FIG. 2 and FIG. 7. FIG. 2 shows a state in which a movable piece 36 is located at a closed position and in which the gripping portion 32 is located at a contact position. FIG. 7 shows a state in which the movable piece 36 is located at an open position and in which the gripping portion 32 is located at a retreat position.

The divided members 27 include two movable pieces 36 that are held so as to be movable with respect to the spin base 7. The two movable pieces 36 are adjacent to each other in the circumferential direction of the annular member 4. The movable piece 36 has its one end 37 (i.e., an end relative to the circumferential direction) and its opposite end 38 (i.e., an end relative to the circumferential direction). The movable piece 36 is rotatable around a vertical axial line that passes through the opposite end 38. The spin chuck 2 includes a divided member rotating mechanism 39 that rotates the movable piece 36 around the vertical axial line. The divided member rotating mechanism 39 includes two motors 40 housed in, for example, the spin base 7. The divided member rotating mechanism 39 rotates the movable piece 36 around the vertical axial line between a closed position (shown in FIG. 2) and an open position (shown in FIG. 7). The closed position is a position in which the one end 37 and the opposite end 38 are located on a shared circle that has the center on the rotational axis L1. The open position is a position in which the opposite end 38 is located more outwardly than the one end 37 (in a direction away from the rotational axis L1 of the substrate W).

All of the divided members 27 are located on the shared circle in a state in which the movable piece 36 is disposed at the closed position. When a processing liquid is supplied to the substrate W so as to process the substrate W, the two movable pieces 36 are disposed at the closed positions, respectively. On the other hand, in a state in which the two movable pieces 36 are disposed at the open positions, respectively, the two movable pieces 36 face each other in the horizontal direction with a gap therebetween that is larger than the width of a hand 41 of a transfer robot that transfer substrates W. When a substrate W is carried into the spin chuck 2 by use of the hand 41 and when a substrate W is carried out from the spin chuck 2 by use of the hand 41, the two movable pieces 36 are pre-disposed at the open positions, respectively. The substrate W supported by the hand 41 is moved up and down above the spin base 7 in a state in which the two movable pieces 36 are disposed at the open positions, respectively, and, as a result, the transfer of the substrate W is performed between the supporting portion 31 and the hand 41. At this time, the two movable pieces 36 are disposed at the open positions, respectively, and therefore the hand 41 is prevented from colliding with the movable piece 36.

Figure 8:
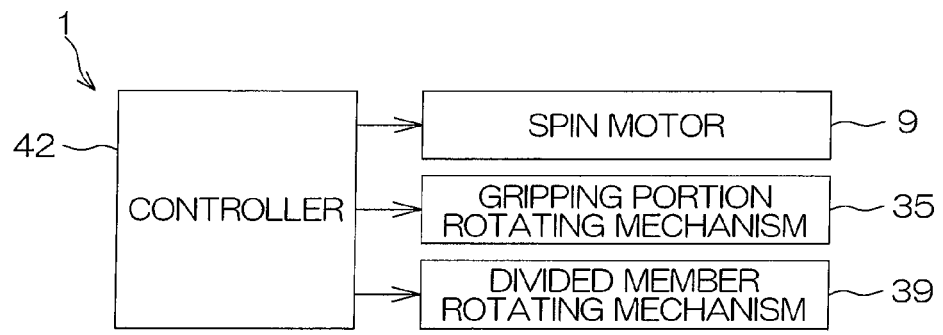
FIG. 8 is a block diagram for describing an electric structure of the substrate processing apparatus according to the first embodiment of the present invention.

FIG. 8 is a block diagram for describing an electric structure of the substrate processing apparatus 1 according to the first embodiment of the present invention.

The substrate processing apparatus 1 includes a controller 42 including a microcomputer. The controller 42 controls the operations of the spin motor 9, the gripping portion rotating mechanism 35, the divided member rotating mechanism 39, etc. The valves of the substrate processing apparatus 1 are controllably opened and closed by the controller 42. According to a preset recipe (i.e., according to processing conditions for processing the substrate W), the controller 42 controls the spin motor 9, the gripping portion rotating mechanism 35, the divided member rotating mechanism 39, and the opening and closing of the valves.

Figure 9:
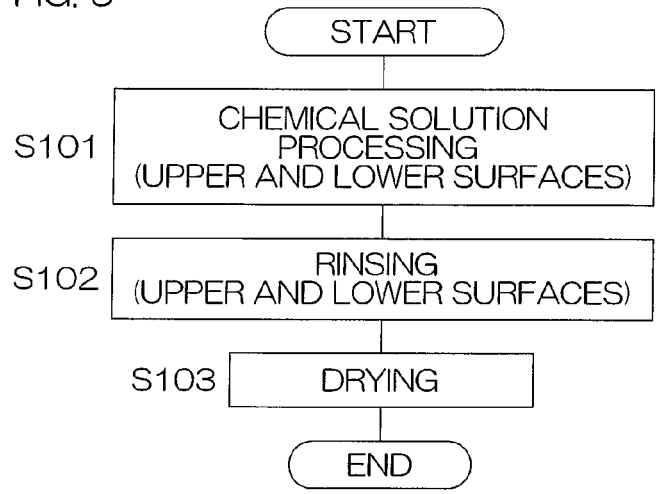
FIG. 9 is a process chart for describing a first processing example when a substrate is processed by the substrate processing apparatus according to the first embodiment of the present invention.
Figure 10:
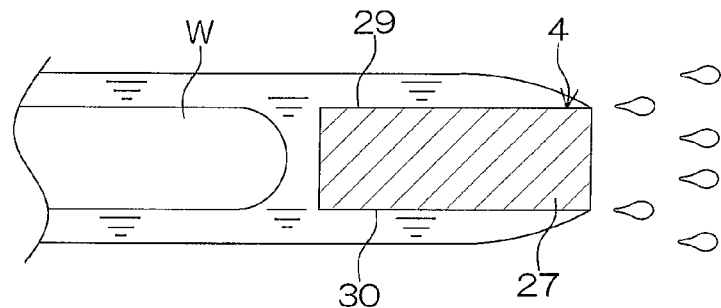
FIG. 10 is a schematic view for describing a state of supplying a processing liquid to a substrate in the first processing example.

FIG. 9 is a process chart for describing a first processing example when a substrate W is processed by the substrate processing apparatus 1 according to the first embodiment of the present invention. FIG. 10 is a schematic view for describing a state of supplying a processing liquid to a substrate W in the first processing example. FIG. 10 shows a state in which the substrate W is horizontally held at the grip positions. Referring to FIG. 1, FIG. 7, FIG. 9, and FIG. 10, a description will be hereinafter given of a processing example performed when a silicone oxide film is removed from a substrate (i.e., silicon substrate) W whose entire area is covered with the silicone oxide film.

An unprocessed substrate W is transferred by the hand 41 of the transfer robot, and is carried into the spin chuck 2 in a state in which a front surface of the substrate W, which is a device forming surface, is directed, for example, upwardly. In more detail, an unprocessed substrate W is placed on the supporting portions 31 by the hand 41 in a state (shown in FIG. 7) in which the gripping portion 32 is located at the retreat position and in which the movable piece 36 is located at the open position. The controller 42 causes the hand 41 to recede, and then moves the movable piece 36 from the open position to the closed position by controlling the divided member rotating mechanism 39. Furthermore, the controller 42 moves the gripping portions 32 from the retreat position to the contact position by controlling the gripping portion rotating mechanism 35. As a result, the supporting portion 31 recedes from the lower surface of the substrate W, and the substrate W is horizontally held in non-contact with the upper surface and in non-contact with the lower surface of the substrate W.

Thereafter, chemical solution processing is performed in which a hydrofluoric acid, which is an example of a chemical solution, is simultaneously supplied to the upper surface, to the lower surface, and to the peripheral end surface of the substrate W (step S101). In more detail, the controller 42 rotates the substrate W and the annular member 4 around the rotational axis L1 by controlling the spin motor 9. Thereafter, the controller 42 causes the first chemical solution nozzle 11 to discharge a hydrofluoric acid by opening the first chemical solution valve 13. The hydrofluoric acid discharged from the first chemical solution nozzle 11 is supplied to the central portion of the upper surface of the substrate W. As a result, a substantially circular liquid film of the hydrofluoric acid is formed at the central portion of the upper surface of the substrate W. This liquid film of the hydrofluoric acid spreads outwardly while receiving a centrifugal force caused by the rotation of the substrate W. This liquid film of the hydrofluoric acid further spreads outwardly by the supply of a subsequent hydrofluoric acid to the upper surface of the substrate W. Therefore, the liquid film of the hydrofluoric acid spreads to the peripheral portion of the upper surface of the substrate W while maintaining its substantially circular shape, and the whole area of the upper surface of the substrate W is covered with the liquid film of the hydrofluoric acid. As a result, the hydrofluoric acid is supplied to the whole area of the upper surface of the substrate W, and the silicone oxide film is removed from the whole area of the upper surface of the substrate W.

On the other hand, the controller 42 causes the lower surface nozzle 18 to discharge a hydrofluoric acid in parallel with the discharge of a hydrofluoric acid from the first chemical solution nozzle 11. In more detail, the controller 42 causes the lower surface nozzle 18 to discharge a hydrofluoric acid by opening the second chemical solution valve 23 while rotating the substrate W and the annular member 4. The hydrofluoric acid discharged from the lower surface nozzle 18 is supplied to the central portion of the lower surface of the substrate W. As a result, a substantially circular liquid film of the hydrofluoric acid is formed at the central portion of the lower surface of the substrate W. Thereafter, this liquid film of the hydrofluoric acid spreads outwardly while receiving a centrifugal force caused by the rotation of the substrate W. This liquid film of the hydrofluoric acid further spreads outwardly by the supply of a subsequent hydrofluoric acid to the lower surface of the substrate W. Therefore, the liquid film of the hydrofluoric acid spreads to the peripheral portion of the lower surface of the substrate W while maintaining its substantially circular shape, and the whole area of the lower surface of the substrate W is covered with the liquid film of the hydrofluoric acid. As a result, the hydrofluoric acid is supplied to the whole area of the lower surface of the substrate W, and the silicone oxide film is removed from the whole area of the lower surface of the substrate W.

As shown in FIG. 10, a portion of the hydrofluoric acid that has reached the peripheral portion of the upper surface of the substrate W enters a space between the peripheral end surface of the substrate W and the annular member 4, and the remaining hydrofluoric acid moves to the upper annular hydrophilic surface 29 of the annular member 4. Likewise, a portion of the hydrofluoric acid that has reached the peripheral portion of the lower surface of the substrate W enters the space between the peripheral end surface of the substrate W and the annular member 4, and the remaining hydrofluoric acid moves to the lower annular hydrophilic surface 30 of the annular member 4. The hydrofluoric acid that has entered the space between the peripheral end surface of the substrate W and the annular member 4 is supplied to the peripheral end surface of the substrate W. The hydrofluoric acid is simultaneously supplied to the upper surface, the lower surface, and the peripheral end surface of the substrate W in this way, and the silicone oxide film is removed from the upper surface, the lower surface, and the peripheral end surface of the substrate W (chemical solution processing). The chemical solution processing is performed during a predetermined time, and then the first chemical solution valve 13 and the second chemical solution valve 23 are closed, and the hydrofluoric acid stops being discharged from the first chemical solution nozzle 11 and the lower surface nozzle 18.

Thereafter, rinsing is performed in which pure water that is an example of a rinsing liquid is simultaneously supplied to the upper surface, the lower surface, and the peripheral end surface of the substrate W (step S102). In more detail, in a state in which the liquid film of the hydrofluoric acid is held on the upper surface and the lower surface of the substrate W, the controller 42 causes the first rinsing liquid nozzle 14 to discharge pure water by opening the first rinsing liquid valve 16 while rotating the substrate W and the annular member 4. The pure water discharged from the first rinsing liquid nozzle 14 is supplied to the central portion of the upper surface of the substrate W. The hydrofluoric acid held on the central portion of the upper surface of the substrate W is swept away outwardly by the pure water discharged from the first rinsing liquid nozzle 14. The pure water supplied to the upper surface of the substrate W spreads outwardly while receiving a centrifugal force caused by the rotation of the substrate W. Therefore, the hydrofluoric acid held on the upper surface of the substrate W is swept away outwardly by the pure water spreading outwardly. As a result, the hydrofluoric acid is rinsed away from the upper surface of the substrate W, and the liquid film of the hydrofluoric acid with which the whole area of the upper surface of the substrate W is covered is replaced with the liquid film of the pure water.

On the other hand, the controller 42 causes the lower surface nozzle 18 to discharge pure water in parallel with the discharge of pure water from the first rinsing liquid nozzle 14. In more detail, in a state in which the liquid film of the hydrofluoric acid is held on the upper surface and the lower surface of the substrate W, the controller 42 causes the lower surface nozzle 18 to discharge pure water by opening the second rinsing liquid valve 24 while rotating the substrate W and the annular member 4. The pure water discharged from the lower surface nozzle 18 is supplied to the central portion of the lower surface of the substrate W. The hydrofluoric acid held on the central portion of the lower surface of the substrate W is swept away outwardly by the pure water discharged from the lower surface nozzle 18. The pure water supplied to the lower surface of the substrate W spreads outwardly while receiving a centrifugal force caused by the rotation of the substrate W. Therefore, the hydrofluoric acid held on the lower surface of the substrate W is swept away outwardly by the pure water spreading outwardly. As a result, the hydrofluoric acid is rinsed away from the lower surface of the substrate W, and the liquid film of the hydrofluoric acid with which the whole area of the lower surface of the substrate W is covered is replaced with the liquid film of the pure water.

As shown in FIG. 10, a portion of the pure water that has reached the peripheral portion of the upper surface of the substrate W enters the space between the peripheral end surface of the substrate W and the annular member 4, and the remaining pure water moves to the upper annular hydrophilic surface 29 of the annular member 4. Likewise, a portion of the pure water that has reached the peripheral portion of the lower surface of the substrate W enters the space between the peripheral end surface of the substrate W and the annular member 4, and the remaining pure water moves to the lower annular hydrophilic surface 30 of the annular member 4. The pure water that has entered the space between the peripheral end surface of the substrate W and the annular member 4 is supplied to the peripheral end surface of the substrate W. The pure water is simultaneously supplied to the upper surface, the lower surface, and the peripheral end surface of the substrate W in this way, and the hydrofluoric acid adhering to the upper surface, to the lower surface, and to the peripheral end surface of the substrate W is rinsed away (rinsing). The rinsing is performed during a predetermined time, and then the first rinsing liquid valve 16 and the second rinsing liquid valve 24 are closed, and the pure water stops being supplied from the first rinsing liquid nozzle 14 and the lower surface nozzle 18.

Thereafter, spin drying is performed in which the substrate W is dried (step S103). In more detail, the controller 42 rotates the substrate W and the annular member 4 at a high rotational speed (for example, several thousand rpm) by controlling the spin motor 9. As a result, a great centrifugal force acts on the pure water adhering to the substrate W and the annular member 4, and this pure water is shaken off toward its surroundings from the substrate W and the annular member 4. The pure water is removed from the substrate W in this way, and the substrate W is dried (spin drying). After the spin drying is performed during a predetermined time, the controller 42 stops the rotation of the substrate W and the annular member 4 by controlling the spin motor 9. Furthermore, the controller 42 moves the movable piece 36 from the closed position to the open position by controlling the divided member rotating mechanism 39, and moves the gripping portion 32 from the contact position to the retreat position by controlling the gripping portion rotating mechanism 35. Thereafter, the already-processed substrate W is carried out from the spin chuck 2 by use of the hand 41 of the transfer robot.

Figure 11:
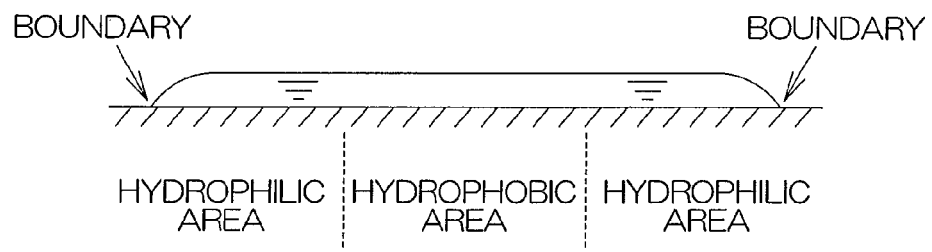
FIG. 11 is a schematic view for describing the spreading of a liquid supplied to a solid surface.

FIG. 11 is a schematic view for describing the spreading of a liquid supplied to a solid surface.

When a liquid is supplied to a hydrophilic solid surface, the liquid spreads along the solid surface, and a thin liquid film is formed thereon. On the other hand, when a liquid is supplied to a hydrophobic solid surface, the liquid does not spread along the solid surface, and liquid droplets are formed thereon. In other words, the hydrophilic solid surface is easily wetted, whereas the hydrophobic solid surface is not easily wetted. However, the present inventor has found that, even if the solid surface has a hydrophobic area, a liquid can be spread along the solid surface in the same way as when a liquid is supplied to the hydrophilic solid surface.

In more detail, the present inventor has found that a boundary (at which the liquid surface intersects with the solid surface) between an area (covered area) covered with a liquid and an area (uncovered area) not covered with the liquid in the solid surface greatly influences the spreading of the liquid. In other words, as shown in FIG. 11, a liquid supplied to the solid surface spreads along the solid surface, and forms a thin liquid film thereon in the same way as when a liquid is supplied to the hydrophilic solid surface if the boundary between the covered area and the uncovered area has reached the hydrophilic area even if the solid surface has a hydrophobic area. Therefore, a large range can be wet with a small amount of liquid if the boundary therebetween is allowed to reach the hydrophilic area.

As described above, in the chemical solution processing that is the first processing example, the hydrofluoric acid is supplied to the substrate W (silicon substrate) whose entire area is covered with the silicone oxide film. The silicone oxide film is hydrophilic. Therefore, the upper surface, the lower surface, and the peripheral end surface of the substrate W, which has not yet been supplied with the hydrofluoric acid, are hydrophilic. Therefore, the liquid film of the hydrofluoric acid can be spread to the peripheral portion of the upper surface and the peripheral portion of the lower surface of the substrate W while maintaining its substantially circular shape, and the whole area of the upper surface and the whole area of the lower surface of the substrate W can be covered with the liquid film of the hydrofluoric acid, for example, without discharging a hydrofluoric acid from the nozzles 11 and 18 at a high flow rate and without rotating the substrate W at a high speed. Hence, the silicone oxide film can be removed from the upper surface, the lower surface, and the peripheral end surface of the substrate W by supplying a hydrofluoric acid to the upper surface, the lower surface, and the peripheral end surface of the substrate W.

On the other hand, when the silicone oxide film is removed from the substrate W, the ground (silicon) of the substrate W is exposed. Therefore, the upper surface, the lower surface, and the peripheral end surface of the substrate W are changed to be hydrophobic, and the substrate W is brought into a not-easily-wetted state. However, as described above, in the chemical solution processing that is the first processing example, the outer edge of the liquid film of the hydrofluoric acid held above the substrate W reaches the upper annular hydrophilic surface 29, whereas the outer edge of the liquid film of the hydrofluoric acid held below the substrate W reaches the lower annular hydrophilic surface 30. In other words, the boundary between the covered area and the uncovered area reaches the hydrophilic area. Therefore, after the silicone oxide film is removed from the substrate W, the hydrofluoric acid spreads along the upper surface and the lower surface of the substrate W in the same way as when a liquid is supplied to the hydrophilic solid surface. Therefore, the hydrofluoric acid can keep being supplied to the whole area of the upper surface and the whole area of the lower surface of the substrate W without discharging the hydrofluoric acid from the nozzles 11 and 18 at a high flow rate. Hence, the hydrofluoric acid can be supplied to the whole area of the upper surface and the whole area of the lower surface of the substrate W while reducing the consumption of the hydrofluoric acid.

In the rinsing that is the first processing example, pure water is supplied to the upper surface and the lower surface of the substrate W in a state in which the liquid film of the hydrofluoric acid is held on the upper surface and the lower surface of the substrate W. Thereafter, the liquid film of the hydrofluoric acid held on the upper surface of the substrate W is replaced with the liquid film of the pure water, and the liquid film of the hydrofluoric acid held on the lower surface of the substrate W is replaced with the liquid film of the pure water. Therefore, the liquid film of the hydrofluoric acid held on the upper and lower surfaces of the substrate W is replaced with the liquid film of the pure water in a state in which the boundary between the covered area and the uncovered area is in a hydrophilic area (i.e., the upper annular hydrophilic surface 29 and the lower annular hydrophilic surface 30). Therefore, pure water can be supplied to the whole area of the upper surface and the whole area of the lower surface of the substrate W without discharging the pure water from the nozzles 14 and 18 at a high flow rate. Hence, the consumption of pure water can be reduced, and pure water can be supplied to the whole area of the upper surface and the whole area of the lower surface of the substrate W even if the upper surface, the lower surface, and the peripheral end surface of the substrate W are hydrophobic.

In the rinsing that is the first processing example, a description has been given of a case in which the liquid film of the hydrofluoric acid held on the upper surface and the lower surface of the substrate W is replaced with the liquid film of the pure water. However, pure water may be supplied to the upper surface and the lower surface of the substrate W in a state in which the liquid film of the hydrofluoric acid with which the whole area of the upper surface and the whole area of the lower surface of the substrate W are covered is not held. After the chemical solution processing is performed, the silicone oxide film has been removed from the substrate W, and therefore the upper surface, the lower surface, and the peripheral end surface of the substrate W are hydrophobic. Therefore, in this case, there is a need to, for example, insert a first flow regulating valve in the first rinsing liquid supply pipe 15 and in the second rinsing liquid supply pipe 22, and, at an initial step of the rinsing, there is a need to, for example, form the liquid film of pure water with which the whole area of the upper surface and the whole area of the lower surface of the substrate W are covered by discharging pure water from the nozzles 14 and 18 at a high flow rate and by rotating the substrate W at a high speed. However, after the outer edge of the liquid film of pure water reaches the upper annular hydrophilic surface 29 and the lower annular hydrophilic surface 30, the pure water spreads along the upper surface and the lower surface of the substrate W in the same way as when a liquid is supplied to a hydrophilic solid surface, and therefore the discharge rate of the pure water from the nozzles 14 and 18 can be reduced by allowing the controller 42 to regulate the valve opening of the first flow regulating valve. Hence, the consumption of the pure water can be reduced, and the pure water can be supplied to the whole area of the upper surface and the whole area of the lower surface of the substrate W.

Likewise, in the first processing example, a description has been given of a case in which the substrate W whose upper surface, whose lower surface, and whose peripheral end surface are hydrophilic is a substrate to be processed. However, the substrate W whose upper surface, whose lower surface, and whose peripheral end surface are hydrophobic may be a substrate to be processed. If so, there is a need to, for example, insert a second flow regulating valve in the first chemical solution supply pipe 12 and the second chemical solution supply pipe 21, and, at an initial step of the chemical solution processing, there is a need to, for example, form the liquid film of a hydrofluoric acid with which the whole area of the upper surface and the whole area of the lower surface of the substrate W are covered by discharging a hydrofluoric acid from the nozzles 11 and 18 at a high flow rate and by rotating the substrate W at a high speed. However, after the outer edge of the liquid film of a hydrofluoric acid reaches the upper annular hydrophilic surface 29 and the lower annular hydrophilic surface 30, the hydrofluoric acid spreads along the upper surface and the lower surface of the substrate W in the same way as when a liquid is supplied to a hydrophilic solid surface, and therefore the discharge rate of the hydrofluoric acid from the nozzles 11 and 18 can be reduced by allowing the controller 42 to regulate the valve opening of the second flow regulating valve. Hence, the consumption of the hydrofluoric acid can be reduced, and the hydrofluoric acid can be supplied to the whole area of the upper surface and the whole area of the lower surface of the substrate W.

As described above, in the first embodiment, the processing liquid supply unit 3 supplies a processing liquid to the upper surface and the lower surface of the substrate W held by the spin chuck 2, and, as a result, it becomes possible to form a liquid film of the processing liquid with which the upper surface of the substrate W is covered and a liquid film of the processing liquid with which the lower surface of the substrate W is covered. Additionally, the outer edge of the liquid film of the processing liquid held on the upper surface of the substrate W can be allowed to reach the upper annular hydrophilic surface 29, and the outer edge of the liquid film of the processing liquid held on the lower surface of the substrate W can be allowed to reach the lower annular hydrophilic surface 30. In other words, the boundary between the covered area and the uncovered area can be located at the upper annular hydrophilic surface 29 and the lower annular hydrophilic surface 30 each of which is a hydrophilic area. Therefore, even if the upper surface and the lower surface of the substrate W are hydrophobic or even if hydrophobic areas are contained in the upper surface and the lower surface of the substrate W, the consumption of the processing liquid can be reduced, and the whole area of the upper surface and the whole area of the lower surface of the substrate W can be covered with the processing liquid. Hence, the upper surface and the lower surface of the substrate W can be processed while reducing the consumption of the processing liquid. Additionally, the upper surface and the lower surface of the substrate W can be simultaneously processed, and therefore a processing time can be shortened.

Second Embodiment

Figure 12:
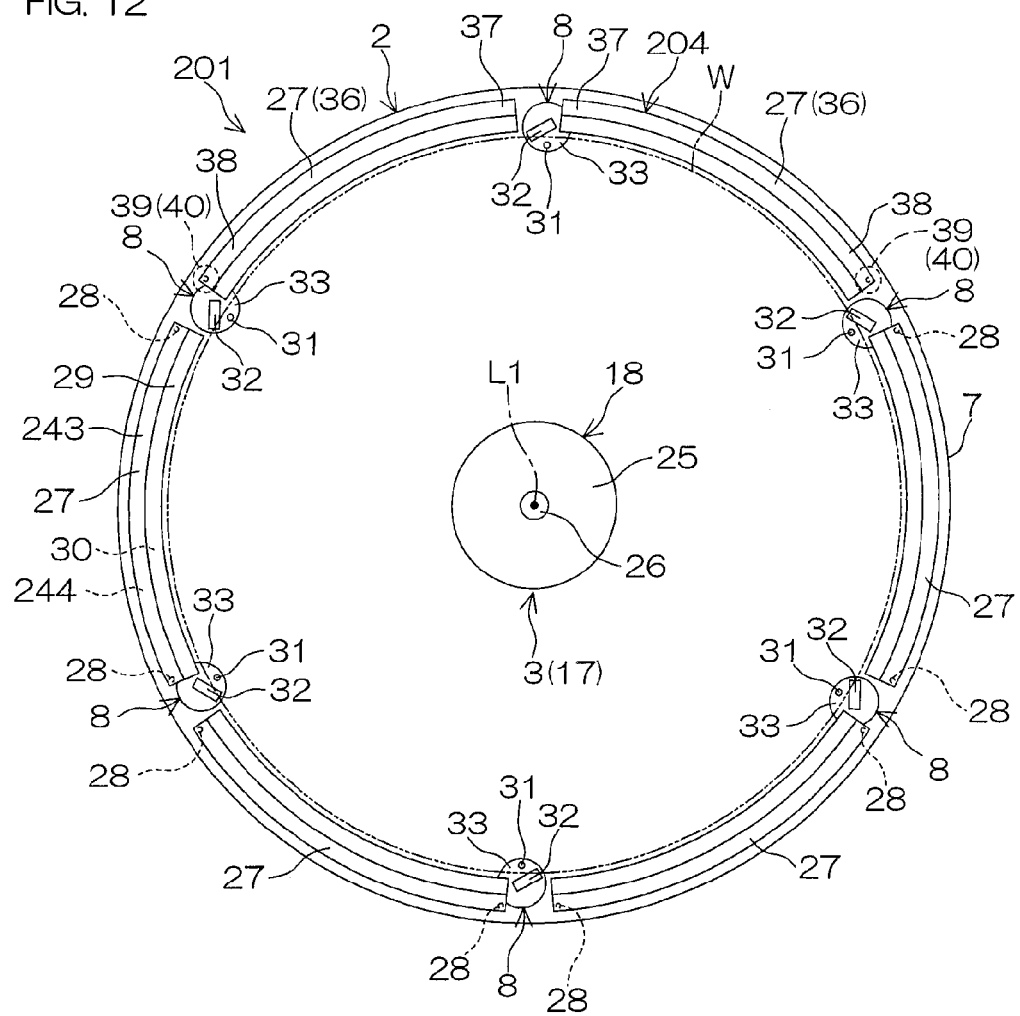
FIG. 12 is a plan view showing a schematic structure of a substrate processing apparatus according to a second embodiment of the present invention.
Figure 13:
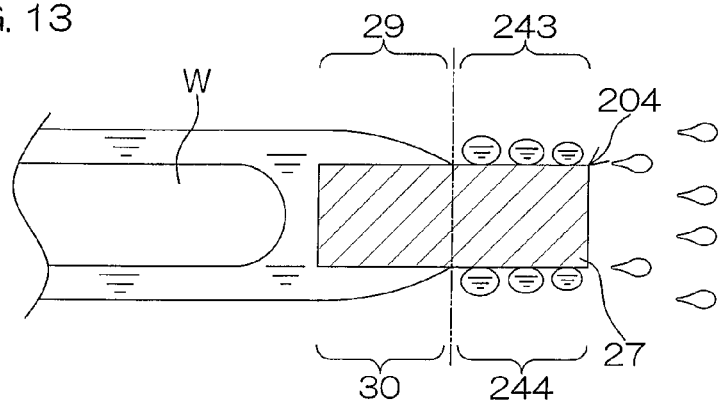
FIG. 13 is a schematic view for describing a state of supplying a processing liquid to a substrate in the second embodiment of the present invention.

FIG. 12 is a plan view showing a schematic structure of a substrate processing apparatus 201 according to a second embodiment of the present invention. FIG. 13 is a schematic view for describing a state of supplying a processing liquid to a substrate W in the second embodiment of the present invention. FIG. 13 shows a state in which the substrate W is horizontally held at the grip position. In FIG. 12 and FIG. 13, the same reference characters as in FIGS. 1 to 11 are given to components identical with those of FIGS. 1 to 11, respectively, and a description of these components is omitted.

A main difference between this second embodiment and the first embodiment mentioned above is that a hydrophilic surface and a hydrophobic surface are provided on the upper surface and on the lower surface of the annular member.

In more detail, the substrate processing apparatus 201 includes an annular member 204 (hydrophilic surface placing unit) that surrounds the substrate W held by the spin chuck 2. The annular member 204 has an upper annular hydrophobic surface 243 (annular hydrophobic surface) that surrounds the upper annular hydrophilic surface 29 and a lower annular hydrophobic surface 244 (annular hydrophobic surface) that surrounds the lower annular hydrophilic surface 30. The upper annular hydrophilic surface 29 and the upper annular hydrophobic surface 243 are provided on the upper surface of the annular member 204 (i.e., on the upper surface of the divided member 27), and the upper annular hydrophobic surface 243 is disposed outside the upper annular hydrophilic surface 29. Likewise, the lower annular hydrophilic surface 30 and the lower annular hydrophobic surface 244 are provided on the lower surface of the annular member 204 (i.e., on the lower surface of the divided member 27), and the lower annular hydrophobic surface 244 is disposed outside the lower annular hydrophilic surface 30. The upper annular hydrophobic surface 243 is disposed along a horizontal plane including the upper surface of the substrate W held at the grip position, whereas the lower annular hydrophobic surface 244 is disposed along a horizontal plane including the lower surface of the substrate W held at the grip position. The contact angle of water with respect to the upper annular hydrophobic surface 243 and with respect to the lower annular hydrophobic surface 244 is greater than the contact angle of water with respect to the upper annular hydrophilic surface 29 and with respect to the lower annular hydrophilic surface 30. In other words, the upper annular hydrophobic surface 243 and the lower annular hydrophobic surface 244 are greater in hydrophobicity than the upper annular hydrophilic surface 29 and the lower annular hydrophilic surface 30. The contact angle of water with respect to the upper annular hydrophobic surface 243 and with respect to the lower annular hydrophobic surface 244 is, for example, 90 degrees or more.

The upper annular hydrophobic surface 243 may be disposed at the same height as the upper surface of the substrate W held at the grip position, or may be disposed below or above the upper surface of the substrate W. Additionally, the upper annular hydrophobic surface 243 may be disposed at the same height as the upper annular hydrophilic surface 29, or may be disposed below or above the upper annular hydrophilic surface 29. Likewise, the lower annular hydrophobic surface 244 may be disposed at the same height as the lower surface of the substrate W held at the grip position, or may be disposed below or above the lower surface of the substrate W. Additionally, the lower annular hydrophobic surface 244 may be disposed at the same height as the lower annular hydrophilic surface 30, or may be disposed below or above the lower annular hydrophilic surface 30. In the second embodiment, the upper annular hydrophilic surface 29 and the upper annular hydrophobic surface 243 are disposed at the same height as the upper surface of the substrate W held at the grip position, and the lower annular hydrophilic surface 30 and the lower annular hydrophobic surface 244 are disposed at the same height as the lower surface of the substrate W.

The controller 42 discharges a processing liquid from the first chemical solution nozzle 11 or the first rinsing liquid nozzle 14 (see FIG. 1) while rotating the substrate W and the annular member 204 by the spin chuck 2 around the rotational axis L1, and supplies the processing liquid to the central portion of the upper surface of the substrate W. As a result, a liquid film of the processing liquid is formed at the central portion of the upper surface of the substrate W. Thereafter, the controller 42 moves the outer edge of the liquid film of the processing liquid held on the upper surface of the substrate W to the upper annular hydrophilic surface 29. Furthermore, in parallel with the discharge of a processing liquid from the first chemical solution nozzle 11 or the first rinsing liquid nozzle 14, the controller 42 discharges a processing liquid from the lower surface nozzle 18 while rotating the substrate W and the annular member 204 by the spin chuck 2, and supplies the processing liquid to the central portion of the lower surface of the substrate W. As a result, a liquid film of the processing liquid is formed at the central portion of the lower surface of the substrate W. Thereafter, the controller 42 moves the outer edge of the liquid film of the processing liquid held on the lower surface of the substrate W to the lower annular hydrophilic surface 30.

The processing liquid that has reached the upper annular hydrophilic surface 29 receives a centrifugal force caused by the rotation of the annular member 204, and moves outwardly. Likewise, the processing liquid that has reached the lower annular hydrophilic surface 30 receives a centrifugal force caused by the rotation of the annular member 204, and moves outwardly. Because the upper annular hydrophobic surface 243 is hydrophobic, the processing liquid that has moved from the upper annular hydrophilic surface 29 to the upper annular hydrophobic surface 243 changes into liquid droplets, and moves outwardly in the liquid-droplet state as shown in FIG. 13. Additionally, because the upper annular hydrophobic surface 243 is hydrophobic, the processing liquid undergoes resistance, and is stopped inside the upper annular hydrophobic surface 243 when the processing liquid moves from the upper annular hydrophilic surface 29 to the upper annular hydrophobic surface 243. Likewise, because the lower annular hydrophobic surface 244 is hydrophobic, the processing liquid that has moved from the lower annular hydrophilic surface 30 to the lower annular hydrophobic surface 244 changes into liquid droplets, and moves outwardly in the liquid-droplet state as shown in FIG. 13. Additionally, because the lower annular hydrophobic surface 244 is hydrophobic, the processing liquid undergoes resistance, and is stopped inside the lower annular hydrophobic surface 244 when the processing liquid moves from the lower annular hydrophilic surface 30 to the lower annular hydrophobic surface 244.

As described above, in the second embodiment, the upper annular hydrophilic surface 29 is surrounded by the upper annular hydrophobic surface 243, and the lower annular hydrophilic surface 30 is surrounded by the lower annular hydrophobic surface 244. The upper annular hydrophobic surface 243 and the lower annular hydrophobic surface 244 are hydrophobic. Therefore, when the processing liquid moves from the upper annular hydrophilic surface 29 to the upper annular hydrophobic surface 243, the processing liquid undergoes resistance, and is stopped inside the upper annular hydrophobic surface 243. Likewise, when the processing liquid moves from the lower annular hydrophilic surface 30 to the lower annular hydrophobic surface 244, the processing liquid undergoes resistance, and is stopped inside the lower annular hydrophobic surface 244. Hence, it is possible to maintain a state in which the processing liquid is gathered inside the upper annular hydrophobic surface 243 and the lower annular hydrophobic surface 244 and in which the whole area of the upper surface and the whole area of the lower surface of the substrate W are covered with the processing liquid. Hence, the consumption of the processing liquid can be further reduced.

Although a description has been given of a case in which the upper annular hydrophobic surface 243 is disposed at the same height as the upper annular hydrophilic surface 29 in the second embodiment, greater resistance can be applied to the processing liquid moving from the upper annular hydrophilic surface 29 to the upper annular hydrophobic surface 243 if the upper annular hydrophobic surface 243 is disposed above the upper annular hydrophilic surface 29. Likewise, although a description has been given of a case in which the lower annular hydrophobic surface 244 is disposed at the same height as the lower annular hydrophilic surface 30 in the second embodiment, greater resistance can be applied to the processing liquid moving from the lower annular hydrophilic surface 30 to the lower annular hydrophobic surface 244 if the lower annular hydrophobic surface 244 is disposed below the lower annular hydrophilic surface 30. Hence, it is possible to maintain a state in which the processing liquid is gathered inside the upper annular hydrophobic surface 243 and the lower annular hydrophobic surface 244 and in which the whole area of the upper surface and the whole area of the lower surface of the substrate W are covered with the processing liquid. Hence, the consumption of the processing liquid can be further reduced.

Third Embodiment

Figure 14:
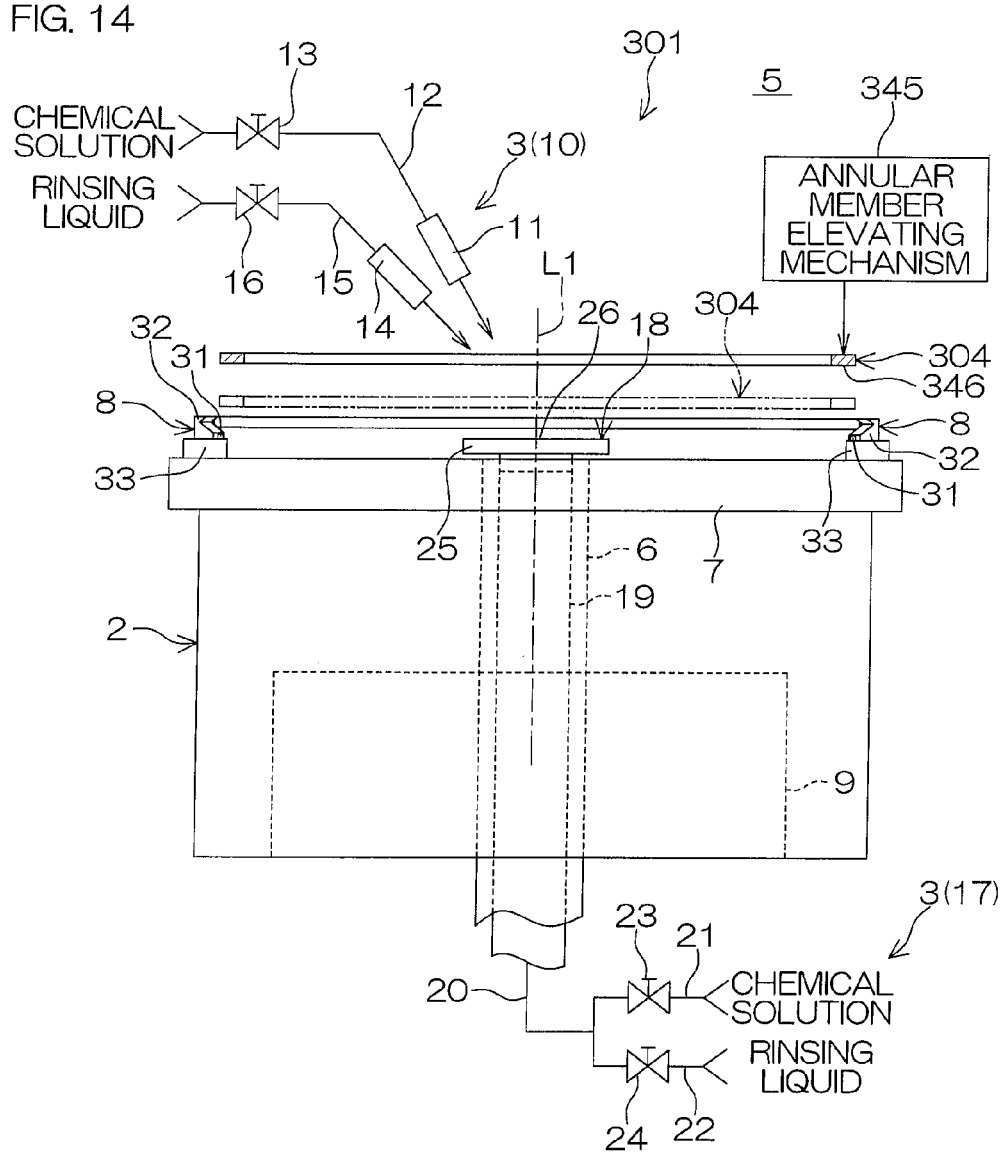
FIG. 14 is a side view showing a schematic structure of a substrate processing apparatus according to a third embodiment of the present invention.
Figure 15A:
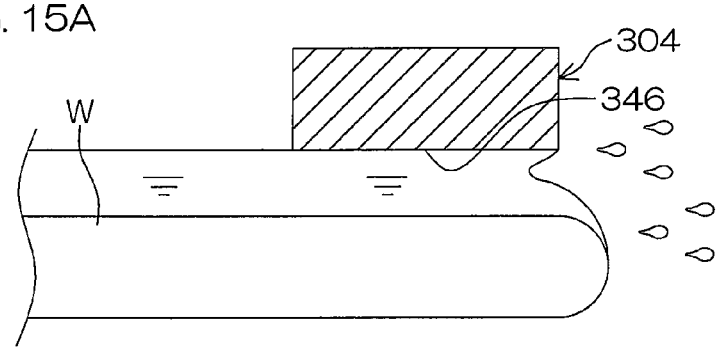
FIG. 15A is a schematic view for describing a state of supplying a processing liquid to a substrate in the third embodiment of the present invention.
Figure 15B:
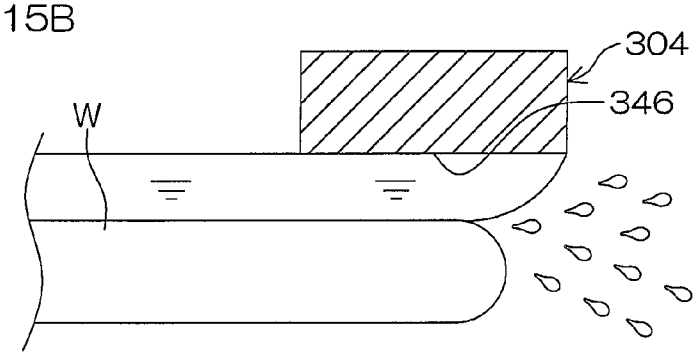
FIG. 15B is a schematic view for describing a first modification example of the annular member according to the third embodiment of the present invention.
Figure 15C:
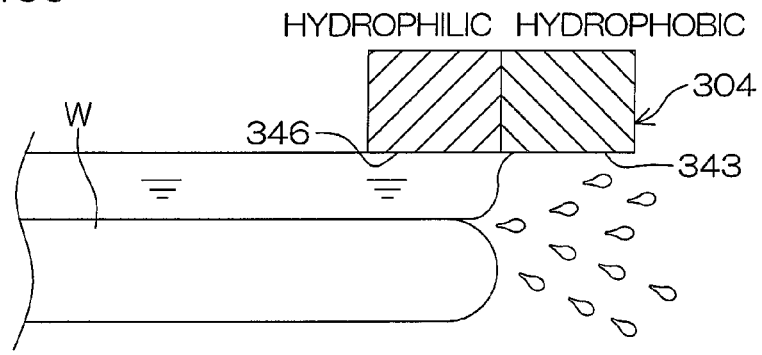
FIG. 15C is a schematic view for describing a second modification example of the annular member according to the third embodiment of the present invention.
Figure 15D:
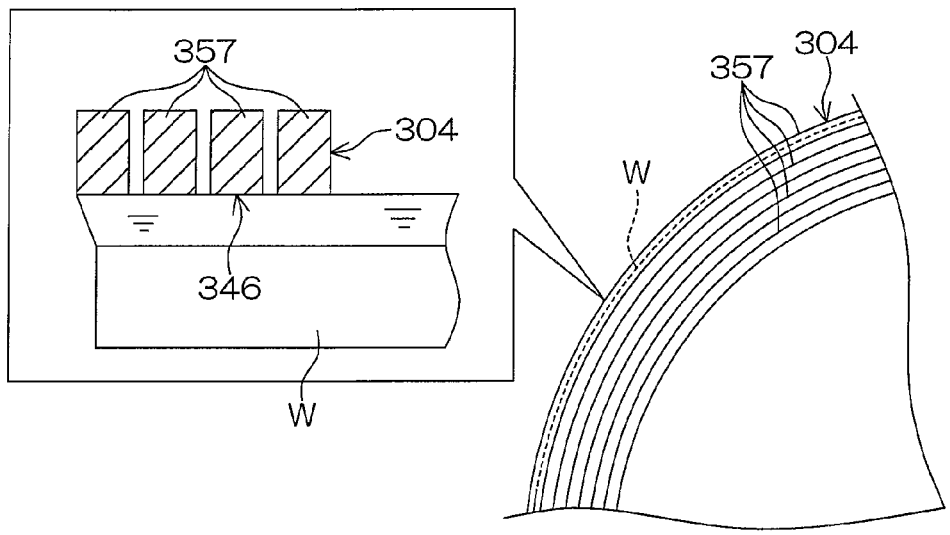
FIG. 15D is a schematic view for describing a third modification example of the annular member according to the third embodiment of the present invention.
Figure 15E:
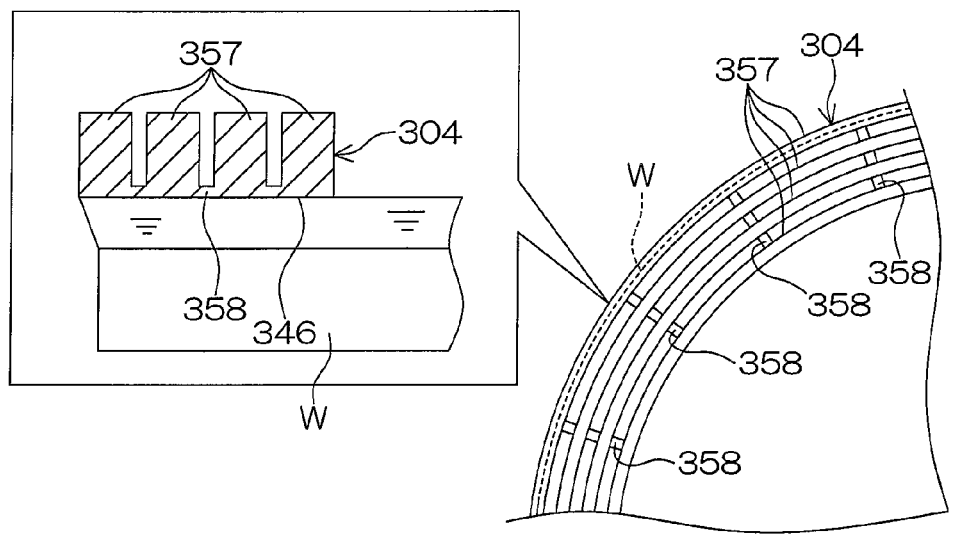
FIG. 15E is a schematic view for describing a fourth modification example of the annular member according to the third embodiment of the present invention.

Next, appropriately referring to FIG. 14 to FIG. 15E, a description will be given of a substrate processing apparatus 301 according to a third embodiment of the present invention. In FIG. 14 and FIG. 15E, the same reference characters as in FIGS. 1 to 13 are given to components identical with those of FIGS. 1 to 13, respectively, and a description of these components is omitted.

FIG. 14 is a side view showing a schematic structure of a substrate processing apparatus 301 according to a third embodiment of the present invention. FIG. 15A is a schematic view for describing a state of supplying a processing liquid to a substrate W in the third embodiment of the present invention. FIG. 15A shows a state in which the substrate W is horizontally held at the grip position and in which an annular member 304 is disposed at a processing position.

A main difference between this third embodiment and the first embodiment mentioned above is that an annular member facing the peripheral portion of the upper surface of the substrate held by the spin chuck is provided instead of the annular member surrounding the substrate held by the spin chuck.

In more detail, as shown in FIG. 14, the substrate processing apparatus 301 includes an annular member 304 (hydrophilic surface placing unit) that faces the peripheral portion of the upper surface of the substrate W held by the spin chuck 2 and an annular member elevating mechanism 345 that raises and lowers the annular member 304 above the spin base 7. The annular member elevating mechanism 345 includes at least one of, for example, an air cylinder and a ball screw mechanism. The annular member 304 is supported by the annular member elevating mechanism 345. The annular member 304 is disposed above the spin base 7. The annular member 304 is disposed along a circle that has its center on the rotational axis L1. The annular member 304 is a circular ring, when viewed planarly, which has a cylindrical inner circumferential surface and a cylindrical outer circumferential surface. The inner diameter of the annular member 304 is smaller than the outer diameter of the substrate W held by the spin chuck 2. The outer diameter of the annular member 304 is smaller than the outer diameter of the substrate W held by the spin chuck 2.

At least a portion of the annular member 304 is hydrophilic. With reference to the annular member 304, the whole of the annular member 304 may be made of a hydrophilic material, or a portion of the annular member 304 may be made of a hydrophilic material. For example, only the surface layer of the annular member 304 may be made of a hydrophilic material by coating. Additionally, the surface of the annular member 304 may be a specular surface, or may be a rough surface. In other words, machining or processing for adjusting surface roughness may be applied to the annular member 304. The hydrophilic material may be a material including at least one among, for example, PVC (polyvinyl chloride), quartz, and silicon carbide (SiC).

The annular member 304 has a facing hydrophilic surface 346 (hydrophilic surface) that faces the peripheral portion of the upper surface of the substrate W held by the spin chuck 2. The facing hydrophilic surface 346 is a lower surface of the annular member 304. The contact angle of water with respect to the facing hydrophilic surface 346 is, for example, less than 70 degrees. The annular member elevating mechanism 345 raises and lowers the annular member 304 between a processing position (shown by the alternate long and two short dashed line in FIG. 14) where the facing hydrophilic surface 346 is close to the peripheral portion of the upper surface of the substrate W horizontally held at the grip position and a retreat position (shown by the solid line in FIG. 14) above the processing position. The annular member 304 is disposed at the retreat position when the substrate W is carried into the spin chuck 2 by use of the hand 41 (see FIG. 7) and when the substrate W is carried out from the spin chuck 2 by use of the hand 41. The annular member 304 is disposed at the processing position when the substrate W held by the spin chuck 2 is processed with a processing liquid. The facing hydrophilic surface 346 can be disposed along the peripheral portion of the upper surface of the substrate W horizontally held at the grip position by moving the annular member 304 to the processing position.

The annular member elevating mechanism 345 is controlled by the controller 42 (see FIG. 8). In a state of locating the annular member 304 at the processing position, the controller 42 discharges a processing liquid from the first chemical solution nozzle 11 or from the first rinsing liquid nozzle 14 while rotating the substrate W by the spin chuck 2 around the rotational axis L1. In other words, in a state in which the facing hydrophilic surface 346 has been brought close to the peripheral portion of the upper surface of the substrate W horizontally held at the grip position, the controller 42 supplies a processing liquid to the central portion of the upper surface of the substrate W while rotating the substrate W. As a result, a liquid film of the processing liquid is formed at the central portion of the upper surface of the substrate W. Thereafter, the controller 42 moves the outer edge of the liquid film of the processing liquid held on the upper surface of the substrate W to the peripheral portion of the upper surface of the substrate W.

The outer edge of the liquid film of the processing liquid moves to the peripheral portion of the upper surface of the substrate W, and, as a result, the processing liquid enters a space between the peripheral portion of the upper surface of the substrate W and the facing hydrophilic surface 346. Accordingly, as shown in FIG. 15A, the outer edge of the liquid film of the processing liquid comes into contact with the facing hydrophilic surface 346. In other words, the boundary between the covered area and the uncovered area moves to the hydrophilic area. Therefore, even if the upper surface of the substrate W is hydrophobic, the processing liquid spreads along the upper surface of the substrate W in the same way as when a liquid is supplied to a hydrophilic solid surface. Therefore, the processing liquid can be supplied to the whole area of the upper surface of the substrate W without discharging the processing liquid from the nozzles 11 and 14 at a high flow rate. Hence, the consumption of the processing liquid can be reduced, and the processing liquid can be supplied to the whole area of the upper surface of the substrate W.

As described above, the annular facing hydrophilic surface 346 that faces the peripheral portion of the upper surface of the substrate W held by the spin chuck 2 is provided in the third embodiment, and therefore the processing liquid can be allowed to enter the space between the peripheral portion of the upper surface of the substrate W and the facing hydrophilic surface 346 by supplying the processing liquid to the upper surface of the substrate W held by the spin chuck 2 by means of the processing liquid supply unit 3. Hence, the outer edge of the liquid film of the processing liquid held on the upper surface of the substrate W can be allowed to reach the facing hydrophilic surface 346. In other words, the boundary between the covered area and the uncovered area can be located at the facing hydrophilic surface 346 that is a hydrophilic area. Therefore, the consumption of the processing liquid can be reduced, and the whole area of the upper surface of the substrate W can be covered with the processing liquid even if the upper surface of the substrate W is hydrophobic or even if a hydrophobic area is contained in the upper surface of the substrate W.

In the third embodiment, the facing hydrophilic surface 346 is hydrophilic, and therefore, when a processing liquid comes into contact with the facing hydrophilic surface 346, the processing liquid spreads along the facing hydrophilic surface 346, and is held by the facing hydrophilic surface 346. In other words, the processing liquid is trapped by the facing hydrophilic surface 346, and a state in which the facing hydrophilic surface 346 is wetted is maintained. Therefore, for example, even if the flow rate of a processing liquid to be supplied to the substrate W is varied by the pulsation of a pump used to send the processing liquid to a nozzle, a state (i.e., fluid-tight state) is maintained in which a space between the facing hydrophilic surface 346 and the substrate W is filled with the processing liquid. Therefore, the liquid film of the processing liquid can be restrained or prevented from being broken from its peripheral portion because of the occurrence of the running out of the liquid between the facing hydrophilic surface 346 and the substrate W. Hence, it is possible to maintain a state in which the processing liquid held on the upper surface of the substrate W is continuous. Therefore, without supplying the processing liquid to the substrate W at a high flow rate, it is possible to maintain a state in which the whole area of the upper surface of the substrate W is covered with the liquid film of the processing liquid.

Additionally, in the third embodiment, the facing hydrophilic surface 346 is continuous over its whole circumference, and faces the peripheral portion of the upper surface of the substrate W over its whole circumference with a fixed distance (for example, 3 mm or less) therebetween. In other words, the magnitude of a clearance between the facing hydrophilic surface 346 and the substrate W is constant over its whole circumference. Therefore, the flow rate of a processing liquid that flows between the facing hydrophilic surface 346 and the substrate W and that is discharged from the substrate W is constant in each position. Therefore, the liquid film of the processing liquid can be restrained or prevented from being broken from its peripheral portion because of the quantitative over-concentration of the processing liquid discharged from the substrate W. Hence, without supplying the processing liquid to the substrate W at a high flow rate, it is possible to maintain a state in which the whole area of the upper surface of the substrate W is covered with the liquid film of the processing liquid. Still additionally, the facing hydrophilic surface 346 is in non-contact with the peripheral portion of the upper surface of the substrate W, and therefore the processing liquid is also supplied reliably to the peripheral portion of the upper surface of the substrate W. Therefore, evenness in processing can be restrained or prevented from being lowered.

A description has been hereinbefore given of a case in which the outer diameter of the annular member 304 is smaller than the outer diameter of the substrate W. However, the outer diameter of the annular member 304 may be equal to the outer diameter of the substrate W, or may be greater than that of the substrate W. In any case, the outer edge of the liquid film of the processing liquid held on the upper surface of the substrate W can be allowed to reach the facing hydrophilic surface 346. Hence, the whole area of the upper surface of the substrate W can be covered with the processing liquid while reducing the consumption of the processing liquid. Additionally, if the outer diameter of the annular member 304 is greater than the outer diameter of the substrate W as shown in FIG. 15B, the scattering direction of a processing liquid discharged from the substrate W is limited by the outer circumferential portion of the annular member 304. In other words, the processing liquid is restrained from being scattered from the peripheral portion of the upper surface of the substrate W in an obliquely upward direction. Hence, the scattering range of the processing liquid can be narrowed.

Additionally, a description has been hereinbefore given of a case in which only the facing hydrophilic surface 346 is provided with the lower surface of the annular member 304. However, as shown in FIG. 15C, not only the facing hydrophilic surface 346 but also an annular hydrophobic surface 343 surrounding the facing hydrophilic surface 346 may be provided with the lower surface of the annular member 304. In other words, the annular member 304 may include a hydrophilic portion having the facing hydrophilic surface 346 and a hydrophobic portion having the annular hydrophobic surface 343. The annular hydrophobic surface 343 is a continuous annular surface over its whole circumference. The annular hydrophobic surface 343 is disposed along a horizontal plane common to both the facing hydrophilic surface 346 and the annular hydrophobic surface 343. The height of the annular hydrophobic surface 343 may be the same as the facing hydrophilic surface 346, or may differ from that of the facing hydrophilic surface 346. The contact angle of water with respect to the annular hydrophobic surface 343 is greater than the contact angle of water with respect to the facing hydrophilic surface 346. The contact angle of water with respect to the annular hydrophobic surface 343 is greater than, for example, 70 degrees.

If the facing hydrophilic surface 346 and the annular hydrophobic surface 343 are provided with the annular member 304 as shown in FIG. 15C, resistance from the annular hydrophobic surface 343 is applied to the processing liquid when the processing liquid moves outwardly from the facing hydrophilic surface 346, and, as a result, the processing liquid is stopped inside the annular hydrophobic surface 343. Therefore, without supplying the processing liquid to the substrate W at a high flow rate, it is possible to reliably maintain a state in which the whole area of the upper surface of the substrate W is covered with the processing liquid. Therefore, the upper surface of the substrate W can be reliably prevented from being exposed from the processing liquid.

If the facing hydrophilic surface 346 and the annular hydrophobic surface 343 are provided with the annular member 304, the diameter in the boundary position between the facing hydrophilic surface 346 and the annular hydrophobic surface 343 may be greater than the outer diameter of the substrate W, or may be smaller than the outer diameter of the substrate W. However, if the diameter in the boundary position therebetween is too greater than the outer diameter of the substrate W, resistance from the annular hydrophobic surface 343 will not be applied to the processing liquid on the substrate W. Therefore, it is preferable to set the diameter in the boundary position therebetween at the outer diameter of the substrate W or less.

Additionally, a description has been hereinbefore given of a case in which the annular member 304 is shaped to be continuous in the radial direction and in the circumferential direction. However, the annular member 304 may be divided into a plurality of portions in the radial direction, or may be partially cut off. In other words, as shown in FIG. 15D, the annular member 304 may include a plurality of split rings 357 concentrically spaced in the radial direction. Alternatively, as shown in FIG. 15E, the annular member 304 may include a plurality of split rings 357 and a plurality of connection portions 358 by which the split rings 357 are partially connected together. In any case, the area of the lower surface of the annular member 304 is smaller than the area obtained when the annular member 304 is continuous in the radial direction and in the circumferential direction. Therefore, particles contained in the processing liquid can be restrained from adhering to the lower surface of the annular member 304. Hence, the substrate W can be restrained or prevented from being contaminated by the movement of the particles from the annular member 304 to the substrate W.

Fourth Embodiment

Next, appropriately referring to FIG. 16 to FIG. 19, a description will be given of a substrate processing apparatus 401 according to a fourth embodiment of the present invention. In FIG. 16 to FIG. 19, the same reference characters as in FIGS. 1 to 15E are given to components identical with those of FIGS. 1 to 15E, respectively, and a description of these components is omitted.

Figure 16:
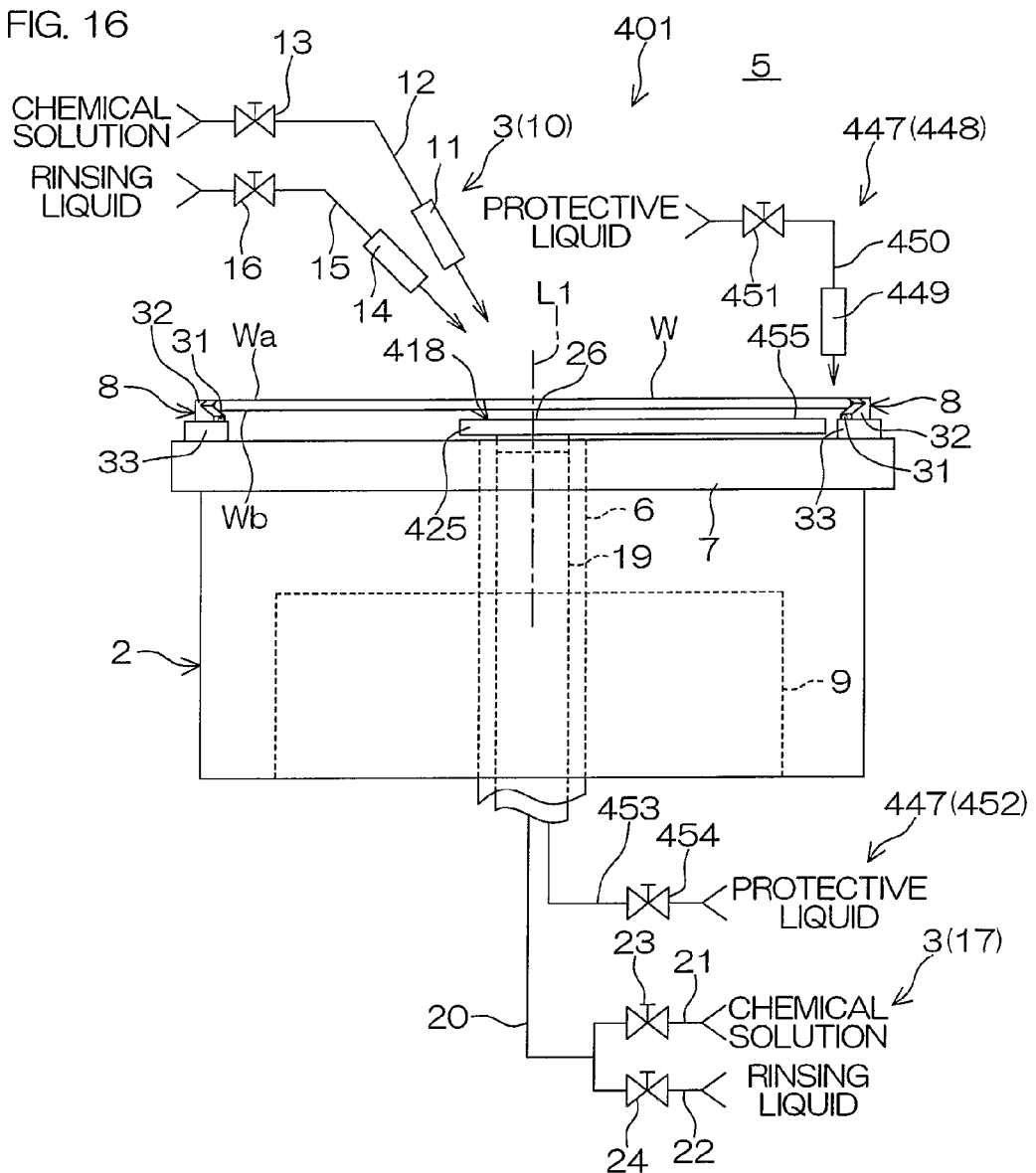
FIG. 16 is a side view showing a schematic structure of a substrate processing apparatus according to a fourth embodiment of the present invention.
Figure 17:
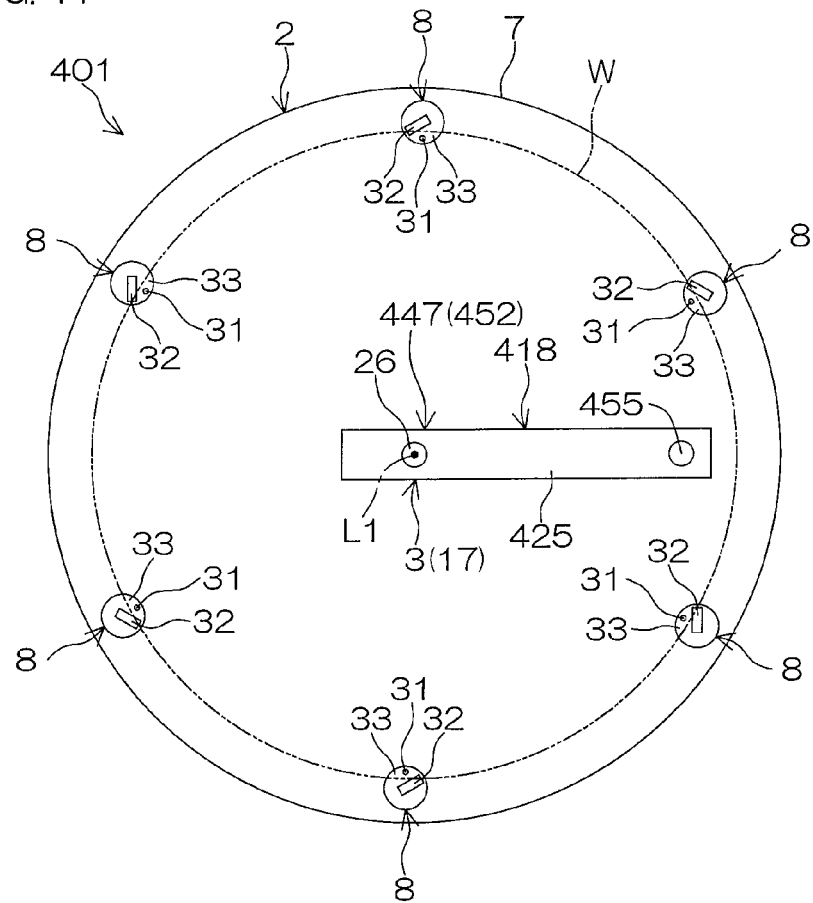
FIG. 17 is a plan view showing the schematic structure of the substrate processing apparatus according to the fourth embodiment of the present invention.

FIG. 16 is a side view showing a schematic structure of a substrate processing apparatus 401 according to a fourth embodiment of the present invention. FIG. 17 is a plan view showing the schematic structure of the substrate processing apparatus 401 according to the fourth embodiment of the present invention.

A main difference between this fourth embodiment and the first embodiment mentioned above is that a protective liquid supply unit that supplies a protective liquid to a substrate is provided instead of the annular member.

In more detail, the substrate processing apparatus 401 includes a protective liquid supply unit 447 (hydrophilic surface placing unit, protective liquid supply unit) that supplies a protective liquid, which protects a substrate W from a processing liquid, to a peripheral portion Wa of an upper surface (hydrophilic surface, upper hydrophilic surface) of a substrate W held by the spin chuck 2 and to a peripheral portion Wb of a lower surface (hydrophilic surface, lower hydrophilic surface) thereof. The protective liquid supply unit 447 includes an upper surface protective liquid supply unit 448 (upper surface protective liquid supply unit) that supplies a protective liquid to the peripheral portion Wa of the upper surface of the substrate W held by the spin chuck 2. The upper surface protective liquid supply unit 448 includes a first protective liquid nozzle 449, a first protective liquid supply pipe 450, and a first protective liquid valve 451. The first protective liquid supply pipe 450 is connected to the first protective liquid nozzle 449. The first protective liquid valve 451 is interposed in the first protective liquid supply pipe 450. When the first protective liquid valve 451 is opened, a protective liquid is supplied from the first protective liquid supply pipe 450 to the first protective liquid nozzle 449. When the first protective liquid valve 451 is closed, a protective liquid stops being supplied from the first protective liquid supply pipe 450 to the first protective liquid nozzle 449. The protective liquid discharged from the first protective liquid nozzle 449 is supplied to the peripheral portion Wa of the upper surface of the substrate W held by the spin chuck 2.

The protective liquid supply unit 447 additionally includes a lower surface protective liquid supply unit 452 (lower surface protective liquid supply unit) that supplies a protective liquid to the peripheral portion Wb of the lower surface of the substrate W held by the spin chuck 2. The lower surface protective liquid supply unit 452 includes a lower surface nozzle 418, a second protective liquid supply pipe 453, and a second protective liquid valve 454. In other words, in the fourth embodiment, the lower surface nozzle 418 is shared between the lower surface processing liquid supply unit 17 and the lower surface protective liquid supply unit 452. The lower surface nozzle 418 includes a facing portion 425 that faces the lower surface of the substrate W held by the spin chuck 2. The facing portion 425 is disposed above the spin base 7. The facing portion 425 is shaped like, for example, a rod that extends in the horizontal direction from the central portion of the spin base 7 when viewed planarly. The facing portion 425 includes a processing liquid discharge port 26 that discharges a processing liquid toward the central portion of the lower surface of the substrate W held by the spin chuck 2 and a protective liquid discharge port 455 that discharges a protective liquid toward the peripheral portion Wb of the lower surface of the substrate W held by the spin chuck 2.

The second protective liquid supply pipe 453 is connected to the protective liquid discharge port 455. The second protective liquid valve 454 is interposed in the second protective liquid supply pipe 453. A processing liquid flowing through the second processing liquid supply pipe 20 is supplied to the processing liquid discharge port 26, and a protective liquid flowing through the second protective liquid supply pipe 453 is supplied to the protective liquid discharge port 455. Therefore, when the second protective liquid valve 454 is opened, a protective liquid is supplied from the second protective liquid supply pipe 453 to the protective liquid discharge port 455. As a result, a protective liquid is discharged from the protective liquid discharge port 455 toward the peripheral portion Wb of the lower surface of the substrate W. When the second protective liquid valve 454 is closed, a protective liquid stops being supplied to the protective liquid discharge port 455. A liquid including at least one of a rinsing liquid and IPA (isopropyl alcohol) can be mentioned as the protective liquid.

Figure 18:
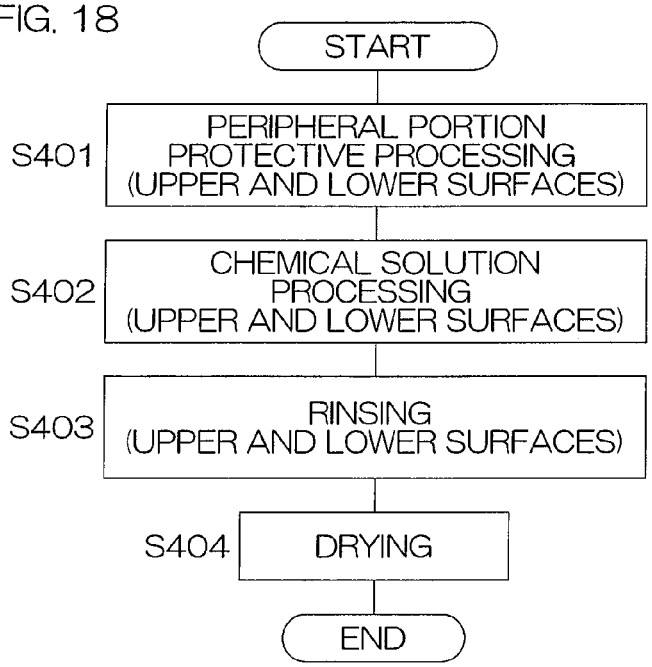
FIG. 18 is a process chart for describing a fourth processing example when a substrate is processed by the substrate processing apparatus according to the fourth embodiment of the present invention.
Figure 19:
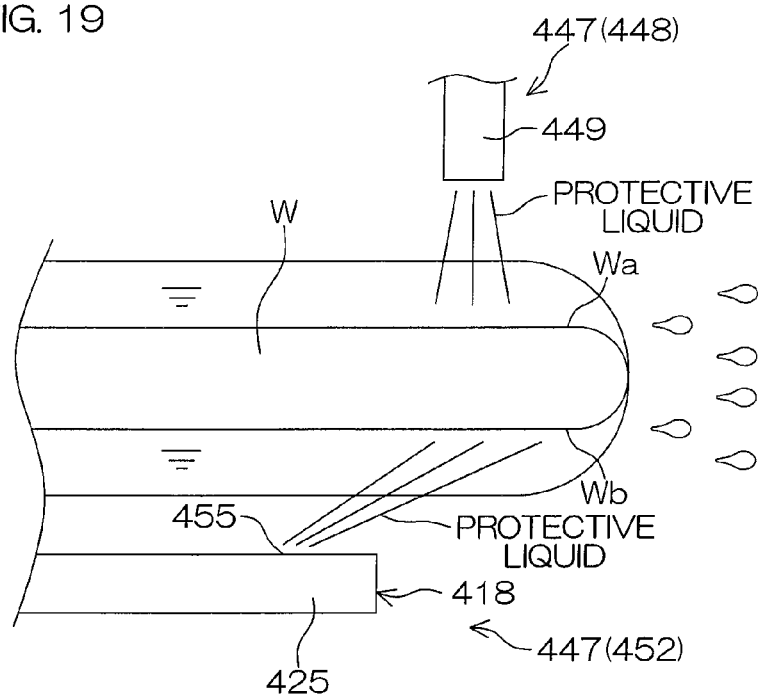
FIG. 19 is a schematic view for describing a state of supplying a processing liquid to a substrate in the fourth processing example.

FIG. 18 is a process chart for describing a fourth processing example when a substrate W is processed by the substrate processing apparatus 401 according to the fourth embodiment of the present invention. FIG. 19 is a schematic view for describing a state of supplying a processing liquid to the substrate W in the fourth processing example. FIG. 19 shows a state in which the substrate W is horizontally held at the grip position. Referring to FIG. 16 to FIG. 19, a description will be hereinafter given of a processing example performed when a silicone oxide film is removed from a substrate W (i.e., silicon substrate) W whose entire area is covered with the silicone oxide film.

An unprocessed substrate W is transferred by the hand 41 (see FIG. 7) of the transfer robot, and is carried into the spin chuck 2 in a state in which a surface of the substrate W, which is a device forming surface, is directed, for example, upwardly. In more detail, an unprocessed substrate W is placed on the supporting portions 31 by the hand 41 in a state in which the gripping portion 32 is located at the retreat position. The controller 42 causes the hand 41 to recede, and then moves the gripping portions 32 from the retreat position to the contact position by controlling the gripping portion rotating mechanism 35 (see FIG. 4). As a result, the supporting portion 31 recedes from the lower surface of the substrate W, and the substrate W is horizontally held in non-contact with the upper surface and in non-contact with the lower surface of the substrate W.

Thereafter, peripheral portion protective processing is performed in which pure water, which is an example of a protective liquid, is simultaneously supplied to the peripheral portion Wa of the upper surface and the peripheral portion Wb of the lower surface of the substrate W (step S401). In more detail, the controller 42 rotates the substrate W held by the spin chuck 2 around the rotational axis L1 by controlling the spin motor 9. Thereafter, the controller 42 causes the first protective liquid nozzle 449 and the protective liquid discharge port 455 to discharge pure water by opening the first protective liquid valve 451 and the second protective liquid valve 454. As shown in FIG. 19, pure water discharged from the first protective liquid nozzle 449 is supplied to the peripheral portion Wa of the upper surface of the substrate W, and flows outwardly along the upper surface of the substrate W. Pure water discharged from the protective liquid discharge port 455 is supplied to the peripheral portion Wb of the lower surface of the substrate W, and flows outwardly along the lower surface of the substrate W. Furthermore, a portion of the pure water discharged from the first protective liquid nozzle 449 and a portion of the pure water discharged from the protective liquid discharge port 455 flow along the peripheral end surface of the substrate W, and, accordingly, pure water is supplied to the peripheral end surface of the substrate W. As a result, the peripheral portion Wa of the upper surface, the peripheral portion Wb of the lower surface, and the peripheral end surface of the substrate W are supplied with pure water, and are protected by the pure water.

Thereafter, chemical solution processing is performed in which a hydrofluoric acid, which is an example of a chemical solution, is simultaneously supplied to the upper surface, the lower surface, and the peripheral end surface of the substrate W (step S402). In more detail, the controller 42 causes the first protective liquid nozzle 449 and the protective liquid discharge port 455 to discharge pure water, and causes the first chemical solution nozzle 11 to discharge a hydrofluoric acid by opening the first chemical solution valve 13 while rotating the substrate W. The hydrofluoric acid discharged from the first chemical solution nozzle 11 is supplied to the central portion of the upper surface of the substrate W. As a result, a substantially circular liquid film of the hydrofluoric acid is formed at the central portion of the upper surface of the substrate W. Thereafter, this liquid film of the hydrofluoric acid receives a centrifugal force caused by the rotation of the substrate W, and spreads outwardly. This liquid film of the hydrofluoric acid further spreads outwardly by the supply of a subsequent hydrofluoric acid to the upper surface of the substrate W. Therefore, the liquid film of the hydrofluoric acid spreads to the peripheral portion Wa of the upper surface of the substrate W without changing its substantially circular shape, and the whole area of the upper surface of the substrate W is covered with the liquid film of the hydrofluoric acid. At this time, the peripheral portion Wa of the upper surface of the substrate W is protected by the pure water, and therefore the hydrofluoric acid is supplied to all areas except the peripheral portion in the upper surface of the substrate W, and the silicone oxide film is removed from these areas. In other words, the silicone oxide film is restrained or prevented from being removed from the peripheral portion Wa of the upper surface of the substrate W.

On the other hand, in parallel with the discharge of a hydrofluoric acid from the first chemical solution nozzle 11, the controller 42 causes the processing liquid discharge port 26 of the lower surface nozzle 418 to discharge a hydrofluoric acid. In more detail, the controller 42 causes the first protective liquid nozzle 449 and the protective liquid discharge port 455 to discharge pure water by opening the second chemical solution valve 23 while rotating the substrate W, and causes the processing liquid discharge port 26 of the lower surface nozzle 418 to discharge a hydrofluoric acid. The hydrofluoric acid discharged from the processing liquid discharge port 26 of the lower surface nozzle 418 is supplied to the central portion of the lower surface of the substrate W. As a result, a substantially circular liquid film of the hydrofluoric acid is formed at the central portion of the lower surface of the substrate W. This liquid film of the hydrofluoric acid receives a centrifugal force caused by the rotation of the substrate W, and spreads outwardly. This liquid film of the hydrofluoric acid further spreads outwardly by the supply of a subsequent hydrofluoric acid to the lower surface of the substrate W. Therefore, the liquid film of the hydrofluoric acid spreads to the peripheral portion Wb of the lower surface of the substrate W without changing its substantially circular shape, and the whole area of the lower surface of the substrate W is covered with the liquid film of the hydrofluoric acid. At this time, the peripheral portion Wb of the lower surface of the substrate W is protected by the pure water, and therefore the hydrofluoric acid is supplied to all areas except the peripheral portion in the lower surface of the substrate W, and the silicone oxide film is removed from these areas. In other words, the silicone oxide film is restrained or prevented from being removed from the peripheral portion Wb of the lower surface of the substrate W.

A portion of the hydrofluoric acid that has reached the peripheral portion Wa of the upper surface and the peripheral portion Wb of the lower surface of the substrate W flows along the peripheral end surface of the substrate W, and then is shaken off to the periphery of the substrate W. Therefore, the peripheral end surface of the substrate W is covered with the hydrofluoric acid. However, the peripheral end surface of the substrate W is protected by the pure water at this time, and therefore the silicone oxide film is restrained or prevented from being removed from the peripheral end surface of the substrate W. Therefore, the silicone oxide film is removed from all areas except the peripheral portion (i.e., the peripheral portion Wa of the upper surface, the peripheral portion Wb of the lower surface, and the peripheral end surface) of the substrate W (chemical solution processing). The chemical solution processing is performed during a predetermined time, and then the first chemical solution valve 13 and the second chemical solution valve 23 are closed, and the hydrofluoric acid stops being discharged from the first chemical solution nozzle 11 and from the processing liquid discharge port 26 of the lower surface nozzle 418.

Thereafter, rinsing is performed in which pure water that is an example of a rinsing liquid is simultaneously supplied to the upper surface, the lower surface, and the peripheral end surface of the substrate W (step S403). In more detail, in a state in which a liquid film of the hydrofluoric acid is held on the upper surface and the lower surface of the substrate W, the controller 42 causes the first rinsing liquid nozzle 14 to discharge pure water by opening the first rinsing liquid valve 16 while rotating the substrate W. Furthermore, after the start of the discharge of pure water from the first rinsing liquid nozzle 14 or simultaneously with the discharge of pure water therefrom, the controller 42 closes the first protective liquid valve 451, and stops discharging the pure water from the first protective liquid nozzle 449. The pure water discharged from the first rinsing liquid nozzle 14 is supplied to the central portion of the upper surface of the substrate W. The hydrofluoric acid held at the central portion of the upper surface of the substrate W is swept away outwardly by the pure water discharged from the first rinsing liquid nozzle 14. The pure water supplied to the upper surface of the substrate W spreads outwardly while receiving a centrifugal force caused by the rotation of the substrate W. Therefore, the hydrofluoric acid held on the upper surface of the substrate W is swept away outwardly by the pure water spreading outwardly. As a result, the hydrofluoric acid is rinsed away from the upper surface of the substrate W, and the liquid film of the hydrofluoric acid with which the whole area of the upper surface of the substrate W is covered is replaced with the liquid film of the pure water.

On the other hand, in parallel with the discharge of pure water from the first rinsing liquid nozzle 14, the controller 42 causes the processing liquid discharge port 26 of the lower surface nozzle 418 to discharge pure water. In more detail, in a state in which the liquid film of the hydrofluoric acid is held on the upper surface and the lower surface of the substrate W, the controller 42 causes the processing liquid discharge port 26 of the lower surface nozzle 418 to discharge pure water by opening the second rinsing liquid valve 24 while rotating the substrate W. Furthermore, after the start of the discharge of pure water from the processing liquid discharge port 26 of the lower surface nozzle 418 or simultaneously with the discharge of pure water therefrom, the controller 42 closes the second protective liquid valve 454, and stops discharging the pure water from the protective liquid discharge port 455. The pure water discharged from the processing liquid discharge port 26 of the lower surface nozzle 418 is supplied to the central portion of the lower surface of the substrate W. The hydrofluoric acid held at the central portion of the lower surface of the substrate W is swept away outwardly by the pure water discharged from the lower surface nozzle 418. The pure water supplied to the lower surface of the substrate W spreads outwardly while receiving a centrifugal force caused by the rotation of the substrate W. Therefore, the hydrofluoric acid held on the lower surface of the substrate W is swept away outwardly by the pure water spreading outwardly. As a result, the hydrofluoric acid is rinsed away from the lower surface of the substrate W, and the liquid film of the hydrofluoric acid with which the whole area of the lower surface of the substrate W is covered is replaced with the liquid film of the pure water.

A portion of the pure water that has reached the peripheral portion Wa of the upper surface and the peripheral portion Wb of the lower surface of the substrate W flows along the peripheral end surface of the substrate W, and then is shaken off to the periphery of the substrate W. As a result, the pure water is supplied to the peripheral end surface of the substrate W. Therefore, even if the hydrofluoric acid supplied to the substrate W in the chemical solution processing adheres to the peripheral end surface of the substrate W, this hydrofluoric acid is rinsed away by the pure water. The pure water is simultaneously supplied to the upper surface, the lower surface, and the peripheral end surface of the substrate W in this way, and the hydrofluoric acid adhering to the upper surface, to the lower surface, and to the peripheral end surface of the substrate W is rinsed away (rinsing). The rinsing is performed during a predetermined time, and then the first rinsing liquid valve 16 and the second rinsing liquid valve 24 are closed, and the pure water stops being discharged from the first rinsing liquid nozzle 14 and from the processing liquid discharge port 26 of the lower surface nozzle 418.

Thereafter, spin drying is performed in which the substrate W is dried (step S404). In more detail, the controller 42 rotates the substrate W at a high rotational speed (for example, several thousand rpm) by controlling the spin motor 9. As a result, a great centrifugal force acts on the pure water adhering to the substrate W, and this pure water is shaken off toward its surroundings from the substrate W. The pure water is removed from the substrate W in this way, and the substrate W is dried (spin drying). After the spin drying is performed during a predetermined time, the controller 42 stops the rotation of the substrate W by controlling the spin motor 9. Furthermore, the controller 42 moves the gripping portion 32 from the contact position to the retreat position by controlling the gripping portion rotating mechanism 35. Thereafter, the already-processed substrate W is carried out from the spin chuck 2 by use of the hand 41 of the transfer robot.

As described above, in the fourth embodiment, a protective liquid can be simultaneously supplied by the protective liquid supply unit 447 to the peripheral portion Wa of the upper surface and the peripheral portion Wb of the lower surface of the substrate W held by the spin chuck 2. Therefore, as described in, for example, the chemical solution processing of the fourth processing example, the silicone oxide film can be restrained or prevented from being removed from the peripheral portion Wa of the upper surface and the peripheral portion Wb of the lower surface of the substrate W. Therefore, the peripheral portion Wa of the upper surface and the peripheral portion Wb of the lower surface of the substrate W are kept hydrophilic, and chemical solution processing is performed in a state in which the outer edge of the liquid film of the hydrofluoric acid held on the upper surface and on the lower surface of the substrate W is in contact with the peripheral portion Wa of the upper surface and the peripheral portion Wb of the lower surface that are annular hydrophilic surfaces. In other words, chemical solution processing is performed in a state in which the boundary between the covered area and the uncovered area is located in the hydrophilic area. Therefore, a hydrofluoric acid can be supplied to the whole area of the upper surface and the whole area of the lower surface of the substrate W without discharging a hydrofluoric acid from the nozzles 11 and 18 at a high flow rate. Hence, the consumption of the hydrofluoric acid can be reduced, and the hydrofluoric acid can be supplied to the whole area of the upper surface and the whole area of the lower surface of the substrate W.

Additionally, in the fourth processing example, after the start of the discharge of pure water from the first rinsing liquid nozzle 14 or simultaneously with the discharge of pure water therefrom, the controller 42 closes the first protective liquid valve 451, and stops the discharge of pure water from the first protective liquid nozzle 449. Furthermore, after the start of the discharge of pure water from the processing liquid discharge port 26 of the lower surface nozzle 418 or simultaneously with the discharge of pure water therefrom, the controller 42 closes the second protective liquid valve 454, and stops the discharge of pure water from the protective liquid discharge port 455. Therefore, until the liquid film of the hydrofluoric acid held on the upper surface and the lower surface of the substrate W is replaced with the liquid film of the pure water, the peripheral portion Wa of the upper surface and the peripheral portion Wb of the lower surface of the substrate W are protected by pure water discharged from the first protective liquid nozzle 449 and the protective liquid discharge port 455. Therefore, in the rinsing of the fourth processing example, the silicone oxide film can be restrained or prevented from being removed from the peripheral portion Wa of the upper surface and the peripheral portion Wb of the lower surface of the substrate W. Hence, rinsing is performed in a state in which the boundary between the covered area and the uncovered area is located in the hydrophilic area. Therefore, pure water can be supplied to the whole area of the upper surface and the whole area of the lower surface of the substrate W without discharging pure water from the nozzles 14 and 18 at a high flow rate. Hence, the consumption of pure water can be reduced, and pure water can be supplied to the whole area of the upper surface and the whole area of the lower surface of the substrate W.

Additionally, in the fourth processing example, a description has been given of a case in which the silicone oxide film is restrained or prevented from being removed from the peripheral portion Wa of the upper surface and the peripheral portion Wb of the lower surface of the substrate W in the chemical solution processing and the rinsing. However, in the chemical solution processing of the fourth processing example, the silicone oxide film may be removed from the peripheral portion Wa of the upper surface and the peripheral portion Wb of the lower surface of the substrate W. In more detail, in the chemical solution processing of the fourth processing example, the controller 42 may close the first protective liquid valve 451 and the second protective liquid valve 454 before closing the first chemical solution valve 13 and the second chemical solution valve 23, and may stop the discharge of pure water from the first protective liquid nozzle 449 and the protective liquid discharge port 455. In this case, a hydrofluoric acid is also supplied to the peripheral portion Wa of the upper surface, to the peripheral portion Wb of the lower surface, and to the peripheral end surface of the substrate W, and therefore the silicone oxide film is removed from the whole area of the substrate W. Additionally, in this case, the rinsing is required to be performed in a state in which the silicone oxide film has been removed from the whole area of the substrate W, and therefore pure water may be supplied to the whole area of the upper surface and the whole area of the lower surface of the substrate W, for example, by discharging pure water from the nozzles 14 and 18 at a high flow rate and by rotating the substrate W at a high speed.

Fifth Embodiment

Next, a fifth embodiment of the present invention will be described with reference to FIG. 20 to FIG. 22C. In FIG. 20 to FIG. 22C, the same reference characters as in FIGS. 1 to 19 are given to components identical with those of FIGS. 1 to 19, respectively, and a description of these components is omitted.

Figure 20:
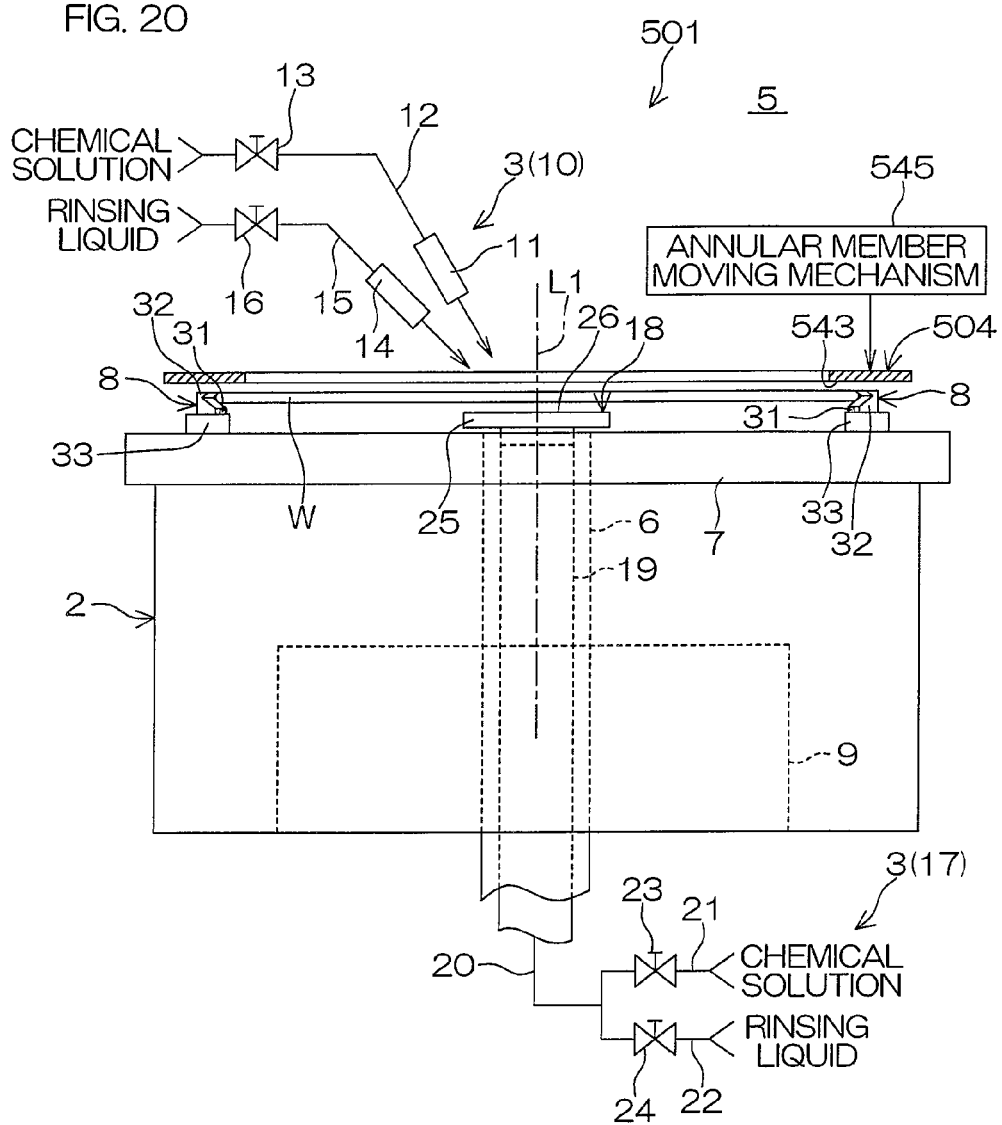
FIG. 20 is a side view showing a schematic structure of a substrate processing apparatus according to a fifth embodiment of the present invention.
Figure 21:
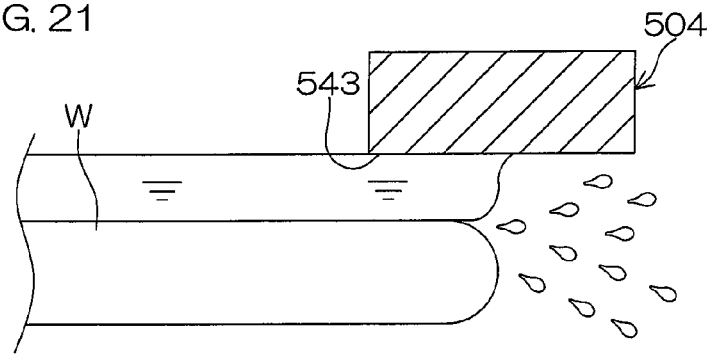
FIG. 21 is a schematic view for describing a state of supplying a processing liquid to a substrate in the fifth embodiment of the present invention.

FIG. 20 is a side view showing a schematic structure of a substrate processing apparatus 501 according to the fifth embodiment of the present invention. FIG. 21 is a schematic view for describing a state of supplying a processing liquid to a substrate W in the fifth embodiment of the present invention. In FIG. 21, a state is shown in which the substrate W is horizontally held at a grip position, and an annular member 504 is disposed at a processing position.

A main difference between this fifth embodiment and the third embodiment mentioned above is that an annular member 504 having a hydrophobic surface is provided instead of the annular member 304 having the hydrophilic surface.

In more detail, the substrate processing apparatus 501 includes a spin chuck 2 (substrate holding unit, substrate rotating unit), a processing liquid supply unit 3 (processing liquid supply unit), an annular member 504, and an annular-member moving mechanism 545 that moves the annular member 504. The spin chuck 2 and the annular member 504 are disposed in a processing chamber 5 defined by a partition wall (not shown).

The annular member 504 is disposed above the substrate W held by the spin chuck 2. The annular member 504 is disposed along a circle having its center on a rotational axis L1. The annular member 504 is a circular ring, when viewed planarly, which has a cylindrical inner circumferential surface and a cylindrical outer circumferential surface. The inner diameter of the annular member 504 is smaller than the diameter of the substrate W held by the spin chuck 2. The outer diameter of the annular member 504 is greater than the diameter of the substrate W held by the spin chuck 2. Therefore, an inner circumferential portion of the annular member 504 is overlapped with the peripheral portion of the upper surface of the substrate W, and faces the peripheral portion of the upper surface of the substrate W with a distance therebetween in the up-down direction. An outer circumferential portion of the annular member 504 is disposed outside the substrate W (i.e., on the opposite side of the rotational axis L1). The inner diameter of the annular member 504 is not limited to a value smaller than the diameter of the substrate W, and may be equal to or greater than the diameter of the substrate W. Likewise, the outer diameter of the annular member 504 is not limited to a value greater than the diameter of the substrate W, and may be equal to or smaller than the diameter of the substrate W.

The annular member 504 is hydrophobic. With reference to the annular member 504, the whole of the annular member 504 may be made of a hydrophobic material, or a portion of the annular member 504 may be made of a hydrophobic material. For example, only the surface layer of the annular member 504 may be made of a hydrophobic material by coating. Additionally, the surface of the annular member 504 may be a specular surface, or may be a rough surface. In other words, machining or processing for adjusting surface roughness may be applied to the annular member 504. The hydrophobic material may be a material including at least one of, for example, GC (glassy carbon) and PTFE (polytetrafluoroethylene).

The annular member 504 has a facing hydrophobic surface 543 (hydrophobic surface) that faces the peripheral portion of the upper surface of the substrate W held by the spin chuck 2. The facing hydrophobic surface 543 is a lower surface of the annular member 504. The contact angle of water with respect to the facing hydrophobic surface 543 is, for example, greater than 70 degrees. The annular-member moving mechanism 545 moves the annular member 504 between a processing position (shown in FIG. 20) where the facing hydrophobic surface 543 is close to the peripheral portion of the upper surface of the substrate W and a retreat position where the facing hydrophobic surface 543 is away from the substrate W. The annular member 504 is disposed at the retreat position when the substrate W is carried into the spin chuck 2 by use of the hand 41 (see FIG. 7) that delivers the substrate W and when the substrate W is carried out from the spin chuck 2 by use of the hand 41. The annular member 504 is disposed at the processing position when the substrate W held by the spin chuck 2 is processed with a processing liquid. The facing hydrophobic surface 543 can be disposed along the peripheral portion of the upper surface of the substrate W by moving the annular member 504 to the processing position.

The annular-member moving mechanism 545 is controlled by the controller 42 (see FIG. 8). In a state in which the annular member 504 is located at the processing position, the controller 42 discharges a processing liquid from the first chemical solution nozzle 11 or from the first rinsing liquid nozzle 14 while rotating the substrate W by the spin chuck 2 around the rotational axis L1. In other words, in a state in which the facing hydrophobic surface 543 has been brought close to the peripheral portion of the upper surface of the substrate W horizontally held at the grip position, the controller 42 supplies a processing liquid to the central portion of the upper surface of the substrate W while rotating the substrate W. As a result, a liquid film of the processing liquid is formed at the central portion of the upper surface of the substrate W. Thereafter, the controller 42 moves the outer edge of the liquid film of the processing liquid held on the upper surface of the substrate W to the peripheral portion of the upper surface of the substrate W.

The outer edge of the liquid film of the processing liquid moves to the peripheral portion of the upper surface of the substrate W, and, as a result, the processing liquid enters a space between the peripheral portion of the upper surface of the substrate W and the facing hydrophobic surface 543. Accordingly, as shown in FIG. 21, the outer edge of the liquid film of the processing liquid comes into contact with the facing hydrophobic surface 543. The facing hydrophobic surface 543 is hydrophobic, and the space between the facing hydrophobic surface 543 and the substrate W is small, and therefore resistance from the facing hydrophobic surface 543 is applied to the processing liquid on the substrate W, and the processing liquid is prevented from being discharged from the substrate W. Therefore, the processing liquid is stored on the substrate W. On the other hand, a centrifugal force is applied to the processing liquid on the substrate W, and therefore the processing liquid on the substrate W is discharged around the substrate W. Therefore, the storage and discharge of the processing liquid are concurrently performed.

The facing hydrophobic surface 543 is disposed along the whole area of the peripheral portion of the upper surface of the substrate W. Therefore, the storage and discharge of the processing liquid are evenly performed in the whole area of the peripheral portion of the upper surface of the substrate W. Therefore, the processing liquid on the substrate W is replaced by a subsequent processing liquid while a state in which the whole area of the upper surface of the substrate W is covered with the liquid film of the processing liquid is maintained. Therefore, the processing liquid can be supplied to the whole area of the upper surface of the substrate W without discharging the processing liquid from the nozzles 11 and 14 at a high flow rate. Hence, a processing liquid can be supplied to the whole area of the upper surface of the substrate W while reducing the consumption of the processing liquid.

Figure 22A:
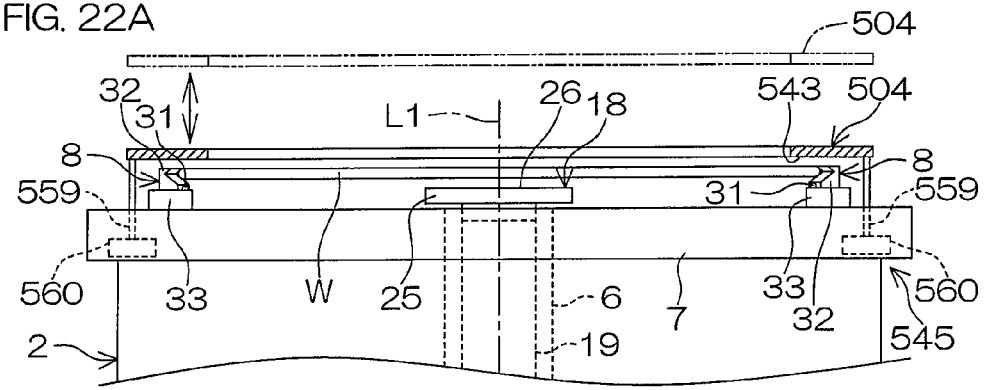
FIG. 22A is a schematic side view for describing a first structural example of an annular-member moving mechanism according to the fifth embodiment of the present invention.
Figure 22B:
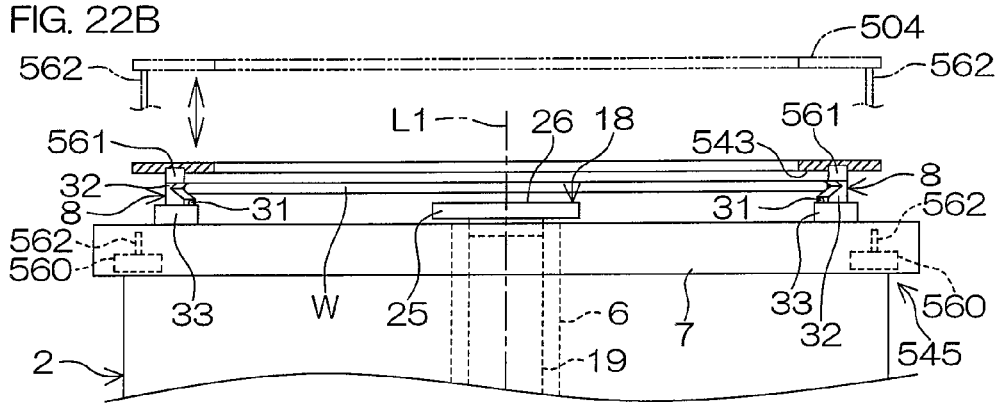
FIG. 22B is a schematic side view for describing a second structural example of an annular-member moving mechanism according to the fifth embodiment of the present invention.
Figure 22C:
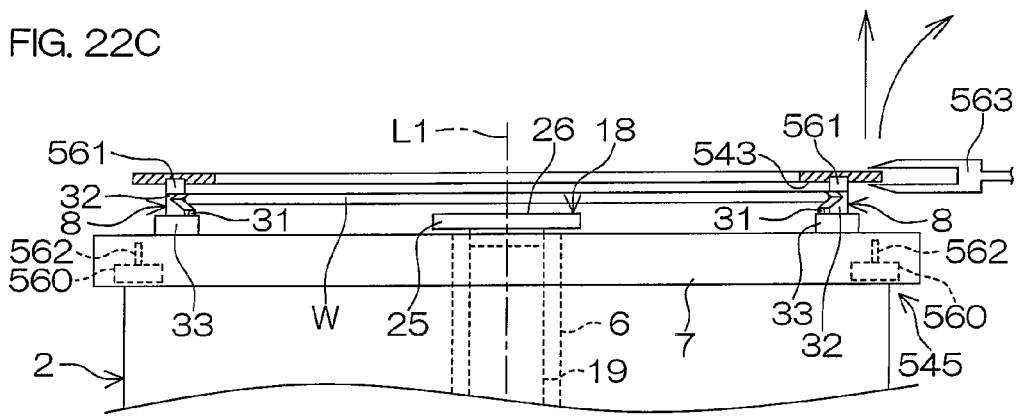
FIG. 22C is a schematic side view for describing a third structural example of an annular-member moving mechanism according to the fifth embodiment of the present invention.

FIG. 22A, FIG. 22B, and FIG. 22C are each a side view showing a schematic structure of the annular-member moving mechanism 545.

As shown in FIG. 22A, the annular-member moving mechanism 545 may include a plurality of fixed shafts 559 fixed to the annular member 504 and a plurality of elevators 560 connected to the fixed shafts 559, respectively. The fixed shafts 559 are disposed around the substrate W. The fixed shafts 559 protrude upwardly from the upper surface of the spin base 7. The annular member 504 is supported by the elevators 560 via the fixed shafts 559. The elevator 560 may be a pneumatic actuator driven by air pressure of, for example, an air cylinder, or may be a solenoid actuator driven by a magnetic force of, for example, an electromagnetic plunger. The elevators 560 move the annular member 504 between the processing position (shown by the solid line) and the retreat position (shown by the alternate long and two short dashed line) by raising and lowering the fixed shafts 559. The elevators 560 are disposed in the spin base 7. The annular member 504, the fixed shafts 559, and the elevators 560 rotate with the spin base 7 around the rotational axis L1.

As shown in FIG. 22B, the annular-member moving mechanism 545 may include a magnet 561 attached to the annular member 504, a plurality of up-and-down shafts 562 that are capable of coming into contact with the annular member 504, and the plurality of elevators 560 connected to the plurality of up-and-down shafts 562, respectively. The annular member 504 is supported by the gripping members 8 at the processing position (shown by the solid line). The annular member 504 is fixed to the gripping members 8 by a magnetic force acting between the magnet 561 attached to the annular member 504 and a magnet (not shown) disposed in the gripping member 8. Therefore, the annular member 504 rotates with the spin base 7 around the rotational axis L1.

The up-and-down shafts 562 are disposed outside the substrate W. The elevators 560 are disposed in the spin base 7. The elevators 560 may be disposed outside the spin base 7. The up-and-down shaft 562 is capable of moving between a protrusion position where the up-and-down shaft 562 protrudes upwardly from the upper surface of the spin base 7 and a retreat position where the entire up-and-down shaft 562 retreats into the spin base 7. The elevator 560 moves the annular member 504 between the processing position and the retreat position (shown by the alternate long and two short dashed line) by raising and lowering the up-and-down shaft 562 between the protrusion position and the retreat position.

In more detail, when the elevator 560 moves the up-and-down shaft 562 from the retreat position to the protrusion position, the up-and-down shaft 562 comes into contact with the annular member 504, and the annular member 504 is raised to the retreat position. On the other hand, when the elevator 560 lowers the up-and-down shaft 562 from the protrusion position to the retreat position, the annular member 504 is supported by the gripping member 8 at the processing position before the up-and-down shaft 562 reaches the retreat position, and, as a result, the up-and-down shaft 562 is brought away from the annular member 504. Thereafter, the entire up-and-down shaft 562 retreats into the spin base 7. Therefore, in a state in which the annular member 504 is in the processing position, the up-and-down shafts 562 recede from the periphery of the substrate W. Therefore, a processing liquid that has been scattered around the substrate W can be prevented from colliding with the up-and-down shaft 562 and rebounding therefrom toward the substrate W.

As shown in FIG. 22C, the annular-member moving mechanism 545 may include the magnet 561, the plurality of up-and-down shafts 562, the plurality of elevators 560, and a hand 563 that holds the annular member 504. The hand 563 receives the annular member 504 from the gripping members 8 or from the up-and-down shafts 562. The hand 563 delivers the annular member 504 to the gripping members 8 or to the up-and-down shafts 562. The hand 563 holds the annular member 504 by gripping the annular member 504 in the up-down direction. The hand 563 may raise and lower the annular member 504 in the up-down direction by going up and going down in the up-down direction while gripping the annular member 504. Additionally, the hand 563 may move the annular member 504 between a horizontal posture and a vertical posture by rotating around the horizontal axis while gripping the annular member 504.

Although it is not shown, if the annular member 504 includes a plurality of divided pieces obtained by being divided in the circumferential direction, the annular-member moving mechanism 545 may move the annular member 504 between the processing position and the retreat position by rotating the divided pieces in a horizontal plane. In this case, the divided piece may be connected to the gripping member 8, and may be rotated with the gripping member 8. Each divided piece may be driven by a motor housed in the spin base 7 in the same way as in the first embodiment of FIG. 7.

As described above, in the fifth embodiment, the facing hydrophobic surface 543 of the annular member 504 is disposed along the peripheral portion of the upper surface of the substrate W at a height differing from that of the substrate W. A processing liquid on the peripheral portion of the upper surface of the substrate W comes into contact with the facing hydrophobic surface 543, and receives resistance from the facing hydrophobic surface 543. Therefore, the discharge of the processing liquid from the substrate W can be regulated, and the processing liquid can be stopped inside the facing hydrophobic surface 543. Therefore, without supplying the processing liquid to the substrate W at a high flow rate, it is possible to maintain a state in which the whole area of the upper surface of the substrate W is covered with the processing liquid.

Additionally, in the fifth embodiment, the facing hydrophobic surface 543 is continuous over its whole circumference, and faces the peripheral portion of the upper surface of the substrate W over its whole circumference with a fixed distance (for example, 3 mm or less) therebetween. In other words, the magnitude of a clearance between the facing hydrophobic surface 543 and the substrate W is constant over its whole circumference. Therefore, the flow rate of a processing liquid that flows between the facing hydrophobic surface 543 and the substrate W and that is discharged from the substrate W is constant in each position. Therefore, the liquid film of the processing liquid can be restrained or prevented from being broken from its peripheral portion because of the quantitative over-concentration of the processing liquid discharged from the substrate W. Still additionally, the hydrophobic surface is in non-contact with the peripheral portion of the upper surface of the substrate W, and therefore the processing liquid is also supplied reliably to the peripheral portion of the upper surface of the substrate W. Therefore, evenness in processing can be restrained or prevented from being lowered.

Other Embodiments

Although the embodiments of the present invention have been described as above, the present invention can be modified and be embodied in various forms within the scope of the appended claims without being limited to the contents of the first to fifth embodiments mentioned above.

For example, in the first to fifth embodiments mentioned above, a case has been described in which a chemical solution is discharged from the first chemical solution nozzle 11 toward the upper surface of the substrate W, and a rinsing liquid is discharged from the first rinsing liquid nozzle 14 toward the upper surface of the substrate W. However, a chemical solution and a rinsing liquid may be selectively discharged from a shared nozzle toward the upper surface of the substrate W.

Additionally, in the first to fifth embodiments mentioned above, a case has been described in which the gripping type spin chuck 2 that horizontally holds a substrate W while gripping the substrate W is provided in the substrate processing apparatus. However, the spin chuck 2 is not limited to the gripping type, and may be, for example, a vacuum-type chuck that horizontally holds a substrate W in non-contact with the upper surface (front surface) of the substrate W by sucking the lower surface (rear surface) of the substrate W in a vacuum manner.

Additionally, in the first, second, and fifth embodiments mentioned above, a case has been described in which the upper surface and the lower surface of the substrate W are simultaneously processed with a processing liquid. However, the upper surface and the lower surface of the substrate W may be processed at different times.

Figure 23:
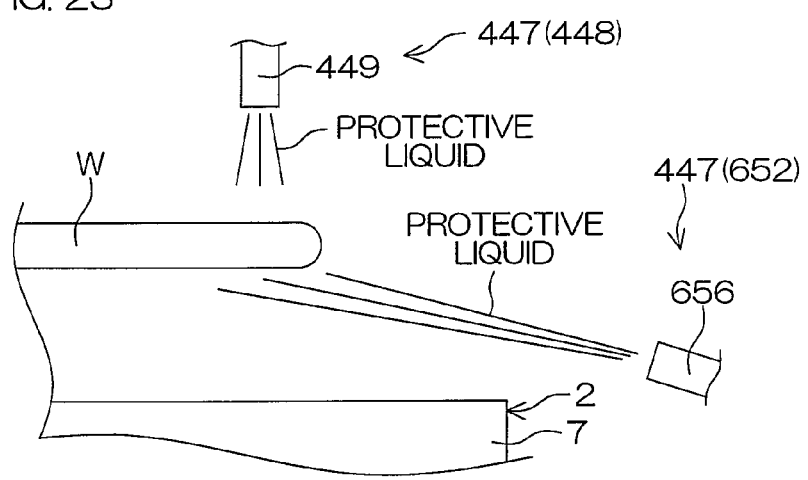
FIG. 23 is a side view showing a schematic structure of a protective liquid supply unit according to a fifth embodiment of the present invention.

Additionally, in the fourth embodiment mentioned above, a case has been described in which the lower surface nozzle 18 is shared between the lower surface processing liquid supply unit 17 and the lower surface protective liquid supply unit 452. However, the lower surface protective liquid supply unit 452 may have a special-purpose second protective liquid nozzle. In more detail, as shown in FIG. 23, a lower surface protective liquid supply unit 652 (lower surface protective liquid supply unit) has a second protective liquid nozzle 656 disposed outside a substrate W horizontally held by the spin chuck 2 at grip positions, and a protective liquid may be discharged from the second protective liquid nozzle 656 toward the peripheral portion of the lower surface of the substrate W.

Additionally, in the first and fifth processing examples mentioned above, a case has been described in which a hydrophilic substrate is a substrate to be processed. However, a hydrophobic substrate may be a substrate to be processed.

Additionally, in the third and fifth embodiments mentioned above, a description has been given of a case in which the annular members 304 and 504 are disposed above the substrate W. However, the annular member 304 may be disposed below the substrate W. Additionally, two annular members 304 may be disposed above and below the substrate W, respectively. The same applies to the annular member 504.

Although the embodiments of the present invention have been described in detail, these embodiments are merely concrete examples used to clarify the technical contents of the present invention, and the present invention should not be understood by being limited to these concrete examples, and the spirit and scope of the present invention are limited solely by the appended claims.

The present application corresponds to Japanese Patent Application No. 2010-215846 filed in the Japan Patent Office on Sep. 27, 2010, and Japanese Patent Application No. 2011-203460 filed in the Japan Patent Office on Sep. 16, 2011, and the entire disclosure of the application is incorporated herein by reference.

What is claimed is:

1. A substrate processing method comprising:
   a holding step of holding a substrate horizontally in non-contact with a major surface of the substrate by bringing a plurality of gripping members into contact with a peripheral surface of the substrate;
   a processing liquid supply step of, in parallel to the holding step, supplying a processing liquid to the major surface of the substrate; and
   a hydrophilic surface placing step of placing a plurality of annular hydrophilic surfaces at respective spaces between the plurality of gripping members along a peripheral portion of the major surface of the substrate such that the plurality of hydrophilic surfaces come into contact with a liquid film of the processing liquid held on the major surface of the substrate in parallel with the processing liquid supply step.

2. The substrate processing method according to claim 1, wherein the processing liquid supply step includes a step of simultaneously supplying the processing liquid to an upper surface and a lower surface of the substrate horizontally held in non-contact with the upper surface of the substrate and in non-contact with the lower surface of the substrate, and
   the hydrophilic surface placing step includes:
   an upper hydrophilic surface placing step of placing an annular upper hydrophilic surface along a peripheral portion of the upper surface of the substrate such that the annular upper hydrophilic surface comes into contact with a liquid film of the processing liquid held on the upper surface of the substrate in parallel with the processing liquid supply step; and
   a lower hydrophilic surface placing step of placing an annular lower hydrophilic surface along a peripheral portion of the lower surface of the substrate such that the annular lower hydrophilic surface comes into contact with a liquid film of the processing liquid held on the lower surface of the substrate in parallel with the processing liquid supply step.

3. The substrate processing method according to claim 1, wherein the plurality of annular hydrophilic surfaces is disposed along a horizontal plane including the major surface of the substrate and surrounds the peripheral portion of the major surface of the substrate.

4. The substrate processing method according to claim 3, further comprising an annular hydrophobic surface placing step of placing an annular hydrophobic surface along the horizontal plane including the major surface of the substrate such that the annular hydrophobic surface surrounds the plurality of annular hydrophilic surfaces.

5. A substrate processing method comprising:
   a processing liquid supply step of supplying a processing liquid to a major surface of a substrate horizontally held in non-contact with the major surface of the substrate;
   a substrate rotating step of rotating the substrate around a rotational axis intersecting with the substrate in parallel with the processing liquid supply step; and a processing-liquid-discharge regulating step of, in parallel with the processing liquid supply step, regulating a discharge of the processing liquid from the substrate by bringing an annular hydrophobic surface into contact with a liquid film of the processing liquid held at the major surface of the substrate, wherein the annular hydrophobic surface is disposed along a horizontal plane, which is on a major surface side of the substrate and different in height from the substrate, such that the annular hydrophobic surface is directed toward the major surface, and the annular hydrophobic surface includes an inner peripheral edge disposed along a peripheral portion of the major surface of the substrate and defining a space located above the liquid film of the processing liquid on the substrate.

6. The substrate processing method according to claim 5, wherein an outer edge of the hydrophobic surface is disposed outside an outer end of the substrate.

7. The substrate processing method according to claim 5, wherein the inner peripheral edge of the hydrophobic surface is disposed inside an outer end of the substrate.

8. The substrate processing method according to claim 5, wherein a distance from the rotational axis to the inner peripheral edge of the hydrophobic surface is greater than a distance from the inner peripheral edge of the hydrophobic surface to an outer peripheral edge of the hydrophobic surface.

9. A substrate processing method comprising:

a processing liquid supply step of supplying a processing liquid to a major surface of a substrate horizontally held in non-contact with the major surface of the substrate while rotating the substrate; and a hydrophilic surface placing step of placing an annular member above the substrate, wherein the annular member includes an inner peripheral edge disposed along a peripheral portion of the major surface of the substrate and defining a space located above the substrate, the annular member having an annular hydrophilic surface provided on a lower surface thereof, thereby placing the annular hydrophilic surface along the peripheral portion of the major surface of the substrate such that the hydrophilic surface comes into contact with a liquid film of the processing liquid held on the major surface of the substrate in parallel with the processing liquid supply step; wherein the annular hydrophilic surface includes an annular facing hydrophilic surface that faces the peripheral portion of the major surface of the substrate in a vertical direction; and the hydrophilic surface placing step includes a step of placing the annular facing hydrophilic surface such that a space between the annular facing hydrophilic surface and the peripheral portion of the major surface of the substrate is filled with the processing liquid.

10. The substrate processing method according to claim 9, further comprising an annular hydrophobic surface placing step of placing an annular hydrophobic surface such that the annular hydrophobic surface surrounds the annular facing hydrophilic surface.

* * * * *